(12) United States Patent
Carson et al.

(10) Patent No.: US 9,953,806 B1
(45) Date of Patent: Apr. 24, 2018

(54) SUBSTRATE ALIGNMENT DETECTION USING CIRCUMFERENTIALLY EXTENDING TIMING PATTERN

(71) Applicant: Doug Carson & Associates, Inc., Cushing, OK (US)

(72) Inventors: Douglas M. Carson, Cushing, OK (US); Mike Chatterton, Stillwater, OK (US); Stephen Houser, Stillwater, OK (US); Bryan Whitfield, Stillwater, OK (US)

(73) Assignee: Doug Carson & Associates, Inc., Cushing, OK (US)

( * ) Notice: Subject to any disclaimer, the term of this patent is extended or adjusted under 35 U.S.C. 154(b) by 0 days.

(21) Appl. No.: 15/470,584

(22) Filed: Mar. 27, 2017

Related U.S. Application Data

(63) Continuation-in-part of application No. 15/081,191, filed on Mar. 25, 2016, now Pat. No. 9,627,179.
(Continued)

(51) Int. Cl.
*H01J 37/30* (2006.01)
*H01L 21/687* (2006.01)
(Continued)

(52) U.S. Cl.
CPC .......... *H01J 37/3005* (2013.01); *H01J 37/20* (2013.01); *H01J 37/3174* (2013.01);
(Continued)

(58) Field of Classification Search
CPC .... H01J 37/3005; H01J 37/20; H01J 37/3174; H01J 2237/2007; H01J 2237/31754;
(Continued)

(56) References Cited

U.S. PATENT DOCUMENTS 3,783,520 A    1/1974 King
4,423,127 A    12/1983 Fujimura
(Continued)

FOREIGN PATENT DOCUMENTS

JP    2009-059808 A2    3/2009
WO    02/059372 A2    8/2002

*Primary Examiner* — David E Smith
(74) *Attorney, Agent, or Firm* — Hall Estill Attorneys at Law

(57) ABSTRACT

Apparatus and method for aligning a rotatable substrate to a support mechanism such as a turntable. The substrate has a circumferentially extending timing pattern comprising at least spaced apart first and second timing marks disposed on opposing sides of a center point of the substrate. The substrate is configured to be mounted to and rotated by the support mechanism about a central axis. The center point of the substrate may be offset from the central axis by an offset distance due to mechanical tolerances associated with the substrate mounting operation. The offset distance may be determined through successive detection of the first and second timing marks by a detector over at least one rotation of the support mechanism and the substrate. A write beam may be adjusted using the determined offset distance to write a second feature to the substrate in alignment with a previously written first feature.

20 Claims, 18 Drawing Sheets

Related U.S. Application Data

(60) Provisional application No. 62/138,776, filed on Mar. 26, 2015.

(51) Int. Cl.
   *H01L 21/67* (2006.01)
   *H01L 23/544* (2006.01)
   *H01J 37/317* (2006.01)
   *H01J 37/20* (2006.01)

(52) U.S. Cl.
   CPC .. *H01L 21/67259* (2013.01); *H01L 21/67282* (2013.01); *H01L 21/68764* (2013.01); *H01L 23/544* (2013.01); *H01J 2237/2007* (2013.01); *H01J 2237/31754* (2013.01); *H01L 2223/54426* (2013.01)

(58) Field of Classification Search
   CPC ......... H01L 23/544; H01L 2223/54426; B01L 3/502707; B01L 2300/0806; B01L 2300/0887
   See application file for complete search history.

(56) References Cited

U.S. PATENT DOCUMENTS

| | | |
|---|---|---|
| 5,444,371 A * | 8/1995 | Tomiski ............. G11B 7/0953 324/212 |
| 5,503,959 A | 4/1996 | Langston |
| 5,796,541 A | 8/1998 | Stein et al. |
| 5,905,850 A | 5/1999 | Kaveh |
| 5,930,577 A | 7/1999 | Forsthoefel et al. |
| 6,509,247 B2 | 1/2003 | Chen et al. |
| 6,622,991 B2 | 9/2003 | Steffes |
| 6,633,451 B1 | 10/2003 | Chainer et al. |
| 6,785,075 B2 | 8/2004 | Bryant et al. |
| 6,856,029 B1 | 2/2005 | Daniel et al. |
| RE39,044 E | 3/2006 | Ross |
| 7,529,051 B2 | 5/2009 | Hanson et al. |
| 8,022,646 B1 | 9/2011 | Sutardja et al. |
| 8,174,634 B2 | 5/2012 | Sirringhaus et al. |
| 8,208,121 B2 | 6/2012 | Bijnen et al. |
| 8,319,510 B2 * | 11/2012 | Ogino ................ G01R 31/2887 324/750.16 |
| 2002/0045105 A1 | 4/2002 | Brown et al. |
| 2005/0078312 A1* | 4/2005 | Fukuzaki ............... H01L 21/68 356/399 |
| 2006/0280078 A1 | 12/2006 | Hanks et al. |
| 2008/0304173 A1 | 12/2008 | Albrecht et al. |
| 2009/0010115 A1 | 1/2009 | Fujita et al. |
| 2010/0061004 A1 | 3/2010 | Carson |
| 2010/0128583 A1 | 5/2010 | Albrecht et al. |
| 2011/0018564 A1 | 1/2011 | Washio et al. |
| 2013/0172985 A1 | 7/2013 | Prestwich et al. |
| 2013/0177129 A1 | 7/2013 | Suzuki |
| 2015/0116690 A1 | 4/2015 | Wang et al. |

* cited by examiner

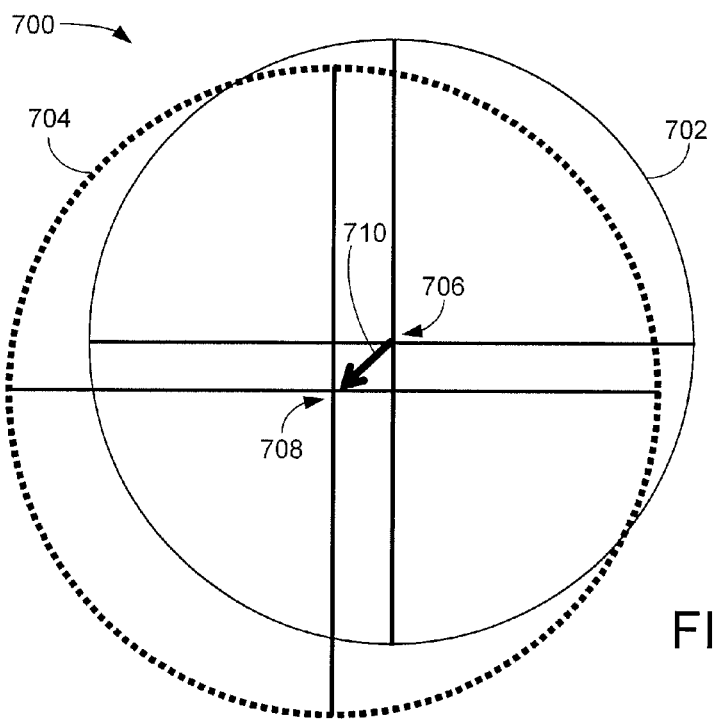
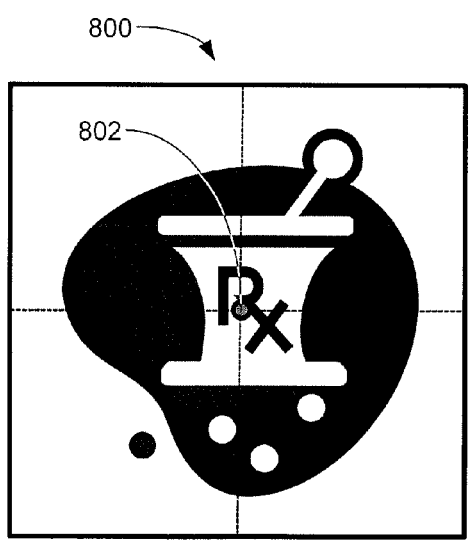
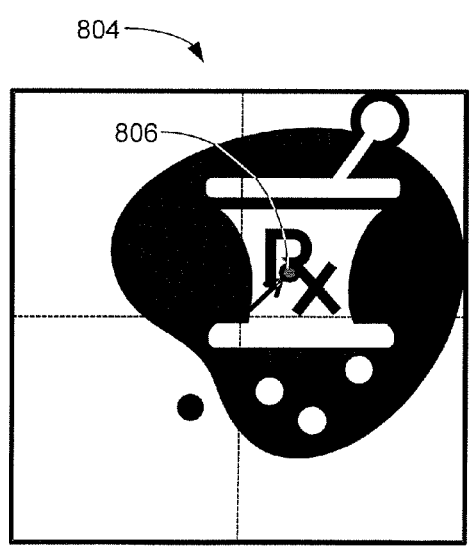
FIG. 7
FIG. 8A
FIG. 8B

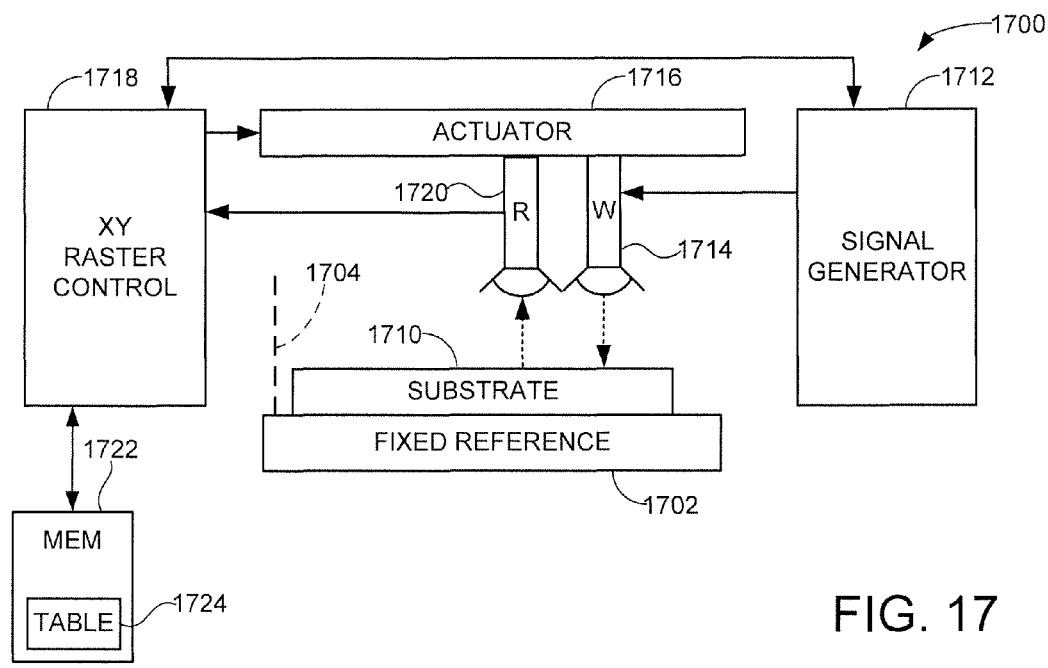
FIG. 17
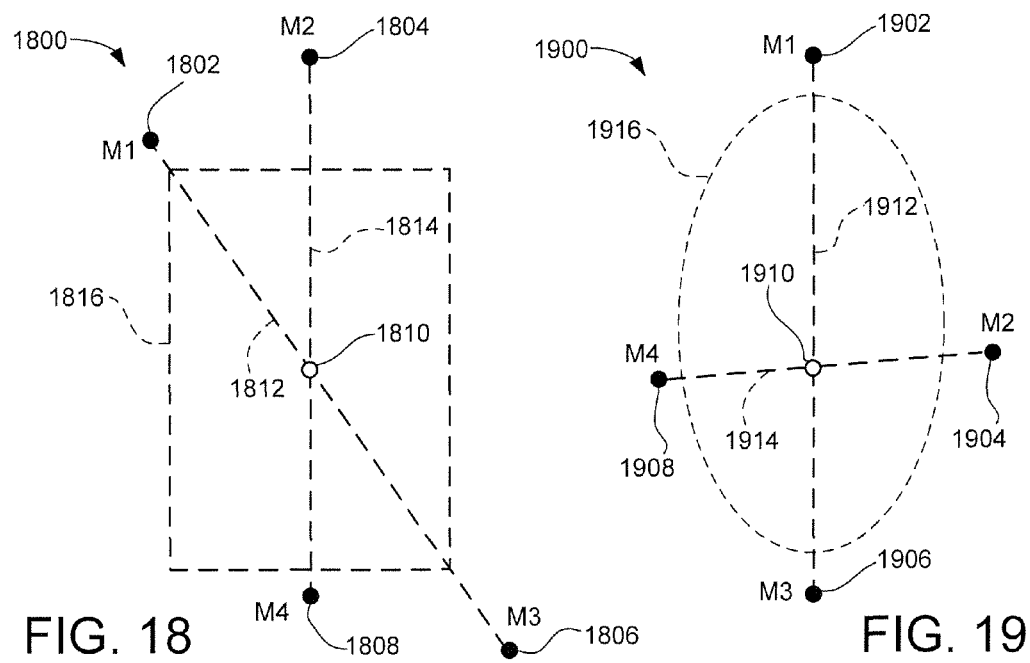
FIG. 18
FIG. 19

COUNT TABLE

| ROTATION | DETECTED MARK CROSSING COUNTS | | | |
|---|---|---|---|---|
| | M1 (Y1) | M2 (X1) | M3 (Y2) | M4 (X2) |
| N-2 | 0 | 0 | 0 | 0 |
| N-1 | 0 | 0 | 0 | 0 |
| N | 0 | 0 | 1 | 0 |
| N+1 | 0 | 1 | 2 | 0 |
| N+2 | 0 | 2 | 3 | 1 |
| N+3 | 0 | 3 | 4 | 2 |
| N+4 | 1 | 4 | 5 | 3 |
| N+5 | 2 | 5 | 6 | 4 |
| N+6 | 3 | 6 | 7 | 5 |
| N+7 | 4 | 7 | 8 | 6 |
| N+8 | 5 | 8 | 9 | 7 |
| N+9 | 6 | 9 | 10 | 8 |
| N+10 | 7 | 10 | 11 | 9 |
| N+11 | 8 | 11 | 12 | 10 |
| ... | ... | ... | ... | ... |

SUBSTRATE ALIGNMENT DETECTION USING CIRCUMFERENTIALLY EXTENDING TIMING PATTERN

RELATED APPLICATIONS

The present application is a continuation-in-part of copending U.S. Utility application Ser. No. 15/081,191 filed Mar. 25, 2016, which in turn makes a claim of domestic priority under 35 U.S.C. 119(e) to U.S. Provisional Application No. 62/138,776 filed Mar. 26, 2015, the contents of both being hereby incorporated herein by reference.

BACKGROUND

Patterns are created on substrates for a variety of applications, such as during the manufacture of optical and magnetic data storage media, semiconductor integrated circuits (ICs), biomedical devices, etc. Depending upon the processing involved, a substrate may be subjected to multiple steps using different types of equipment.

These and other forms of processing may involve mounting the substrate in a recording system such as but not limited to an electron beam recorder (EBR), a laser beam recorder (LBR), etc. In a rotatable type recording system, the substrate is rotated by a support mechanism (sometimes characterized as a "turntable") about a central axis and subjected to a recording beam that writes a recorded pattern to the substrate. In a raster type recording system, the substrate is mounted to a support mechanism (sometimes characterized as a "fixed reference table") and held in a stationary position as a recording beam is advanced across the substrate to write a recorded pattern. The recorded pattern can take the form of any number of linear or circumferentially arranged features including data bits, semiconductor elements, bar codes, images, holograms, three dimensional (3D) structures, etc.

The formation of multi-layer features may require the substrate to be mounted in the recording system, or in other recording systems, multiple successive times to generate features in different layers of the substrate. The substrate may be removed between successive passes for other processing (e.g., metallization, cleaning, chemical or physical vapor deposition, etc.), requiring the substrate to be re-mounted each time a new recording pass is applied.

It can be seen that multi-layer processing requires adequate registration (alignment) of the substrate with a known reference point such that newly written features align with previously recorded features on the substrate. Alignment techniques of the existing art are often inadequate to achieve the requisite registration of the substrate. This is because the relative angular and translational positions of the substrate and the support mechanism will tend to be different for each mounting of the substrate, so the exact centering of the substrate on the support mechanism will tend to be offset for each mounting of the substrate.

SUMMARY

Accordingly, various embodiments of the present disclosure are generally directed to an apparatus and method for aligning a rotatable substrate to a support mechanism, such as but not limited to a turntable of an electron beam recorder (EBR).

In some embodiments, a method includes mounting a substrate to a support mechanism, the substrate having a circumferentially extending timing pattern comprising spaced apart first and second timing marks disposed on opposing sides of a center point of the substrate along a timing mark axis. The support mechanism and the substrate are rotated about a central axis, with the center point of the substrate being offset from the central axis by an offset distance along the timing mark axis. The offset distance is determined responsive to successive detection of the first and second timing marks by a detector over at least one rotation of the support mechanism and the substrate.

In other embodiments, an apparatus is configured to write a feature to a substrate having a circumferentially extending timing pattern comprising spaced apart first and second timing marks disposed on opposing sides of a center point of the substrate along a timing mark axis. The apparatus has a support mechanism configured to rotate the substrate about a central axis, the central axis offset from the center point of the substrate by an offset distance. A detector is moveable with respect to the substrate and configured to respectively detect the first and second timing marks during rotation of the substrate about the central axis by the support mechanism. A control circuit is configured to determine the offset distance responsive to successive detection of the first and second timing marks by the detector over at least one rotation of the support mechanism and the substrate.

BRIEF DESCRIPTION OF DRAWINGS

FIG. 7 illustrates another substrate aligned in accordance with the routine.

FIGS. 8A and 8B illustrate composite patterns (features) that may be written to the substrate of FIG. 7.

FIG. 17 is a raster system operable in accordance with some embodiments to generate and/or detect the exemplary patterns of FIGS. 13 and 14.

FIG. 18 shows another arrangement of an exemplary timing pattern in accordance with some embodiments.

FIG. 19 shows another arrangement of an exemplary timing pattern in accordance with some embodiments.

DETAILED DESCRIPTION

Various embodiments of the present disclosure are generally directed to an apparatus and method for aligning a substrate. As explained below, some embodiments generally involve forming a circumferentially extending timing pattern on a substrate, with the timing pattern nominally extending about a center point of the substrate. The substrate is mounted to a support mechanism having a central axis or other external reference point. The central axis is offset from the center point of the substrate as a result of an alignment error during the mounting of the substrate.

The offset between the support mechanism reference point and the center point of the substrate is determined using a detector that detects the timing pattern. In some embodiments, the substrate is rotated and aspects of the timing pattern, as detected by the detector, are used to identify the center point of the substrate. In other embodiments, the substrate is maintained in a nominally stationary position and a raster scanner or similar mechanism scans the substrate to locate the timing pattern.

In some embodiments, the offset is expressed as translational offset in terms of the respective reference point and center point, and/or angular (rotational) offset of the substrate with respect to the support mechanism. The translational and/or angular offset values can be used to generate compensation values which are applied to adjust the location of a recording (write) beam that impinges the substrate to write features to the substrate. Multiple related embodiments are presented, and each will be discussed in turn.

First Embodiment—Crossover Detection

Figure 1:
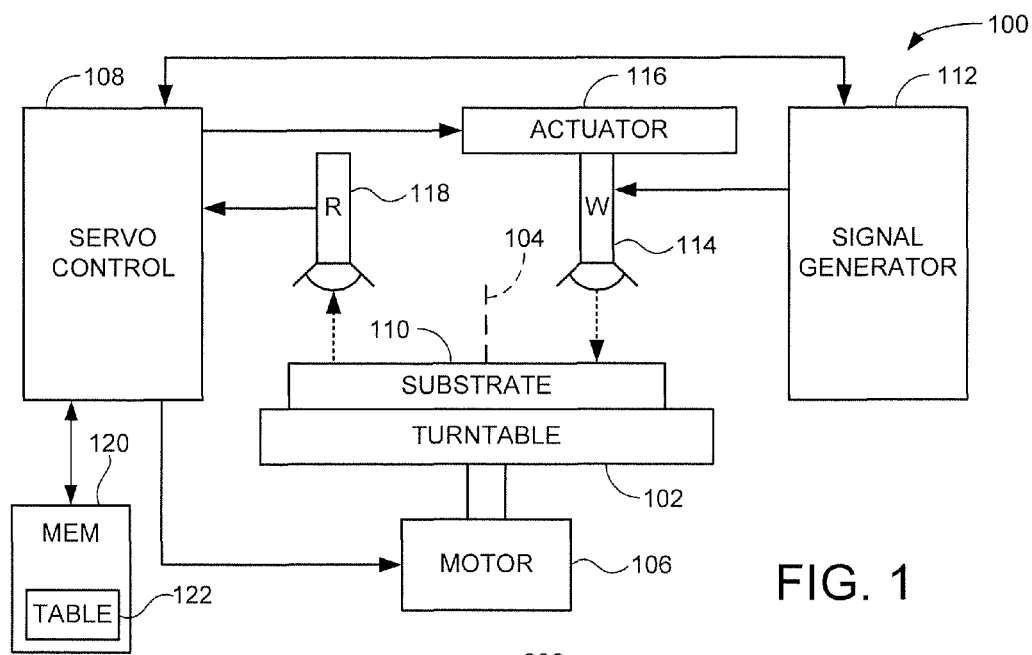
FIG. 1 is a functional block diagram for a recording system constructed and operated in accordance with some embodiments of the present disclosure.

FIG. 1 provides a simplified functional block diagram of a recording system 100 that employs crossover detection to detect substrate alignment. The recording system 100 is characterized as a specially configured electron beam recorder (EBR), but such is merely for purposes of providing an illustrative example and is not limiting. Any number of processing systems can be used, including systems that do not use a recording beam as part of a substrate processing application.

The system 100 includes a support mechanism 102, referred to herein generally as a turntable. The turntable 102 is rotated about a central axis 104 by a motor 106 controlled by a servo control circuit 108. The turntable 102 is rotated about the axis 104 in accordance with a selected velocity profile, which may include constant angular velocity (CAV) rotation and/or constant linear velocity (CLV) rotation.

A substrate 110 is mounted to the turntable 102 for rotation thereby about the central axis 104. In some cases, the substrate 110 may be merely placed on the turntable 102 and adhesive forces (e.g., Van de Walls forces, etc.) may be sufficient to retain the substrate in a mounted relation to the turntable. In other cases, mechanical or other attachment mechanisms, such as a vacuum chuck, etc., may be employed to secure the substrate to the turntable. Regardless, it is contemplated that the substrate is rigidly secured to the turntable and will be rotated therewith during operation of the motor 106.

The substrate 110 can take any number of suitable forms depending on the application. In some cases, the substrate is disc-shaped although such is not necessarily required since the substrate can take substantially any form including rectilinear, irregular, etc. The substrate may be a single layer or multi-layer element.

In some embodiments, the substrate represents a master disc for an optical data recording disc from which a population of nominally identical replicated discs (replicas) are subsequently formed, so that the system 100 is used to expose a layer of the substrate to record features thereto that will ultimately be incorporated into the replicas.

In other embodiments, the substrate may take the form of a semiconductor wafer on which one or more integrated circuits are formed, a magnetic recording disc, a biomedical device, any other form of element to which features are recorded by the recording system 100, or any other form of element to which any type of processing is applied, whether the substrate is rotated or not, provided that the substrate can be at least temporarily rotated (or contrawise, a detection mechanism can be rotated or otherwise translated relative to the substrate) in order to assess the relative location of the substrate, as explained below.

A signal generator circuit 112 is adapted to provide a recording signal to a write transducer (W) 114. In some cases, the recording signal may be a modulation signal such as an extended frequency modulation (EFM) signal with time varying transitions corresponding to boundaries of features to be written to the substrate. The write transducer 114 may take the form of an electron beam generator, a laser diode, a magnetic writer, an emitter, or other mechanism(s) capable of generating energy that impinges the substrate.

In some cases, the modulation signal may provide on-off modulation so that the write beam selectively exposes a selected layer of the substrate 110 (such as a resist or mask layer) when the write transducer 114 is "on." In other cases, power modulation may be supplied so that the recording signal adjusts an applied power of the write beam to different energy levels to write the various features to the substrate. In still other embodiments, deposition processing, such as chemical vapor deposition (CVD) or physical vapor deposition (PVD) techniques may be applied to the substrate. Substantially any form of write beam exposure can be used and indeed, as noted above, such is not necessarily required.

The embodiment of FIG. 1 further shows the recording system 100 to include an actuator 116 which advances the transducer 114 relative to the central axis 104. While not shown, it will be understood that the actuator may include deflection plates or other mechanisms so that the beam is deflected radially or angularly with respect to the central axis even if the transducer itself is not repositioned. The actuator 116 thus provides beam positional control and is under the direction of the servo control circuit 108.

FIG. 1 shows a detector 118, also referred to herein as a reader (R) or read sensor, which detects one or more alignment timing patterns formed on the substrate 110. As explained below, the detection of the timing patterns by the detector 118 serves to allow identification of any translational (e.g., eccentricity) and/or angular offsets of the substrate 110 with respect to the central axis 104. This allows suitable adjustments during a recording operation, such as adjustments in the placement of the write beam, as well as other compensation operations as desired. While FIG. 1 shows the detector 118 to be separate from the transducer 114, in other embodiments the detector may be incorporated into the transducer assembly and translated in a radial direction across the substrate.

A local memory 120 is accessible by the servo control circuit 108 (also referred to as a control circuit) and stores a data structure such as in the form of a look up table 122. As explained below, various parameters may be stored in the table 122 for use by the control circuit. For example, the timing patterns written to the substrate may include identification (ID) values or other multi-bit values that are detected by the detector and passed to the control circuit, which compares with entries in the table 122 to ensure a correct substrate is being processed.

Figure 2:
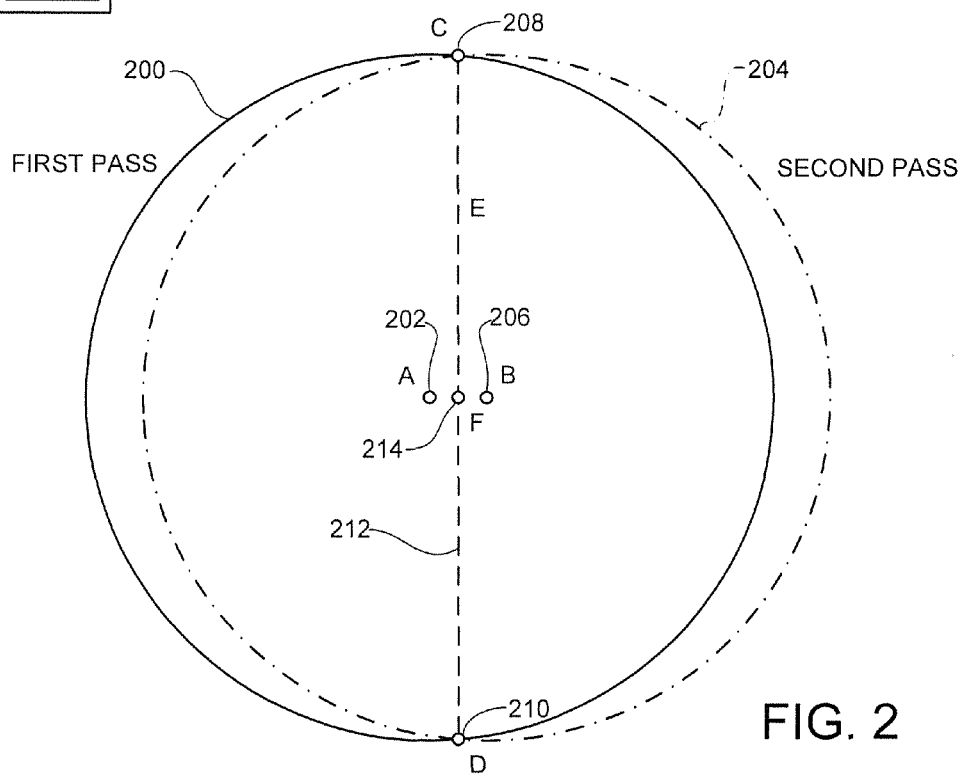
FIG. 2 is a schematic representation of an alignment timing pattern formed by the recording system of FIG. 1 in some embodiments.

FIG. 2 is a schematic representation of a circumferentially extending alignment timing pattern 200 written to the substrate 110 of FIG. 1 in accordance with some embodiments. The pattern 200 can take any number of suitable forms as discussed below, but at this point it will be appreciated that the timing pattern substantially inscribes a full or partial circular path about a center point 202 of the substrate, denoted as point A, at a fixed radius. There is no requirement that the center point 202 be a physical point on the substrate material itself. That is, the center point 202 will be physically resident as an identifiable location on the substrate if the substrate is a solid disc with no central aperture, but the center point may not be physically resident on the substrate material if the substrate has a central aperture in the vicinity of the center point, such as commonly used with optical recording discs and other forms of media.

It is contemplated although not necessarily required that the pattern 200 be written by a recording system such as 100 in FIG. 1 during a first mounting of the substrate 110 to the turntable 102. It is further contemplated in at least some embodiments that the detector 118 in FIG. 1 is positioned at nominally the same radius as the timing pattern 200; in other words, once written, the detector 118 can be positioned to nominally detect the entirety of the timing pattern 200 as the substrate rotates under the detector.

It will be appreciated that the "center point A" 202 may or may not necessarily correspond to the exact center of the substrate 110. Instead, the center point A nominally corresponds to the center of the pattern 200 and thus represents a mathematical point on the substrate that may, or may not, be separately identified by a feature or other mark on the substrate. In one embodiment, the substrate 110 is mounted to the turntable 102 in FIG. 1 a first time with as much precision as is achievable so that the exact center of the substrate is nominally aligned with the exact center of the turntable, e.g., rotational axis 104. Some amount of offset will tend be present, even if miniscule, due to mechanical tolerances.

Once mounted, the substrate 110 is rotated by the turntable 102 about the central axis 104 and the substrate will, based on the construction of the system 100, necessarily rotate about the central axis as well. By maintaining the write beam at a fixed radial distance from the central axis 104 (which may correspond to the radial distance of the detector 118 from the central axis 104), the write transducer 114 can be used to inscribe the timing pattern 200 so as to be nominally centered about point A, as represented in FIG. 2. Stated another way, the center point A 202 represents the location at which the central axis 104 penetrated the substrate when the timing pattern 200 was first written.

Broken line path 204 represents the subsequent location of the timing pattern 200 after the substrate 110 has been removed from the turntable 102, processed using some sort of suitable processing (e.g., metallization, cleaning, chemical or physical vapor deposition, etc.) on other equipment, and returned for re-mounting on the turntable 102. The geometric center of the timing pattern 204 is represented at 206 by point B.

The translational distance between points A and B in FIG. 2 represent the positional error in the substrate between the first time the substrate 110 was mounted to the turntable 102 and the second time the substrate was mounted to the turntable. The actual amount of translational error has been exaggerated in FIG. 2 for clarity of illustration, but it will be appreciated by the skilled artisan that, in most cases, some amount of translational error may arise as a result of mechanical tolerances and other positional errors. Even if a highly accurate robotic arm or other end effector arrangement with closed loop positional control is used to remove and remount the substrate onto the turntable (or onto another turntable), some amount of translational error, such as depicted by the distance A-B, will tend to be present.

Once the substrate 110 is remounted to the turntable 102 in FIG. 1 so as to be offset from its original position by the distance A-B, the pattern 204 will exhibit repeated runout (RRO) eccentricity at a frequency corresponding to the rotational rate (e.g., revolutions per minute, rpm) of the turntable 102. Points C and D, numerically identified at 208 and 210, represent the cross-over points at which the detector 118 (FIG. 1) will detect the offset timing pattern 204.

Figure 3:
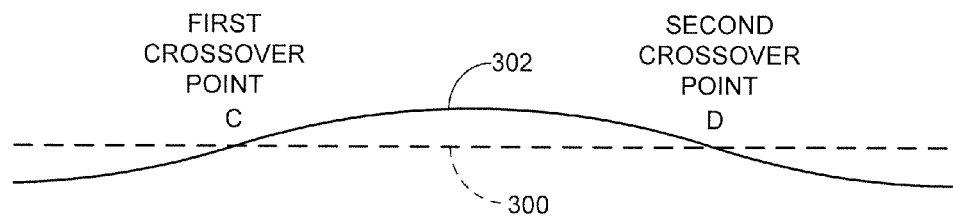
FIG. 3 depicts a detection path sensed by a detector of the recording system of FIG. 1 as it tracks a timing pattern such as represented in FIG. 2.

Referring to FIG. 3, dotted line 300 represents the path along which the detector 118 "travels" as it detects the adjacent rotating substrate. It will be appreciated that the detector 118 is fixed relative to the central axis 104 during the detection operation; hence, it stays in place as the substrate "wobbles" (oscillates) below it. As noted above, the detector may move relative to the substrate to provide the same response. Solid line 302 represents the path taken by the eccentric timing pattern 204 inscribed to the substrate and offset as described above. Point C in FIGS. 2 and 3 represents the point at which the timing pattern moves across the "field of view" of the detector 118 as it crosses over from one radial position to the next. Point D in FIGS. 2 and 3 represents the point at which the offset timing pattern again moves across the field of view of the detector as it crosses over in the opposite direction.

Depending on the detection resolution of the detector 118 and the width of the timing pattern 204, it is contemplated that at these respective points the detector will "observe" the pattern moving across the "field of view" of the detector in a first direction at point C, and moving in the opposite direction at point D. Both the angular and radial locations of these points can be easily determined with reference to the angular position of the turntable (as provided by the servo circuit 108) and the radial position of the detector. The full eccentricity of the pattern may be within the field of view of the detector, so that the cross-over points can be understood as the midpoints of such relative movement and easily ascertained.

Referring again to FIG. 2, once points C and D have been identified, a segment E (line 212) can be mathematically constructed that adjoins these two points, and a midpoint F (point 214) can be identified as the midpoint of segment E. The midpoint F is exactly halfway between points A and B. Hence, by detecting cross-over points C and D, the exact amount of translational offset between points A and B can be calculated. The distance A-B is 2 times the distance from F-B. Point A is known because it corresponds to the central axis 104 about which the substrate 110 and turntable 102 are currently rotating. Point F is derived as the midway point between points C and D.

Once the amount of offset between points A and B is known, suitable compensation values can be applied. In some embodiments, the eccentricity of the substrate based on the translation from point A to point B can be fed forward as an RRO compensation signal to the actuator 116. In this way, a subsequently recorded feature (or portion thereof) can be aligned with a previously written feature that was written to the substrate 110 while the substrate was rotated about point A (202).

Figure 4A:
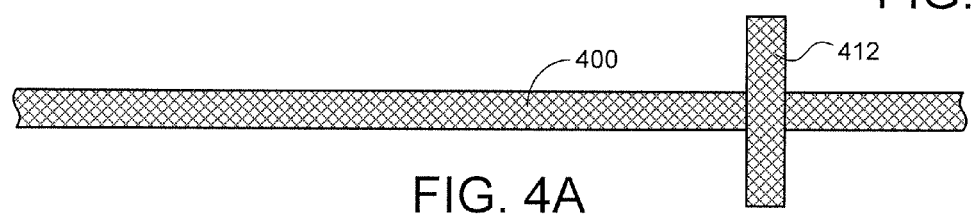
FIGS. 4A-4D provide exemplary forms of timing patterns that can be formed by the recording system.
Figure 4B:

The actual form of the timing pattern can vary depending on the requirements of a given application. In some embodiments, the timing pattern may take the form of a circumferentially extending pattern 400 of nominally uniform width, as represented in FIG. 4A. The pattern may instead be a sequence of discrete features, such as pits 402 separated by lands 404 as depicted in FIG. 4B. The pits and lands can be constant length or can vary around the circumference of the substrate as required to provide angular information with regard to the locations of the cross-over points.

Figure 4C:
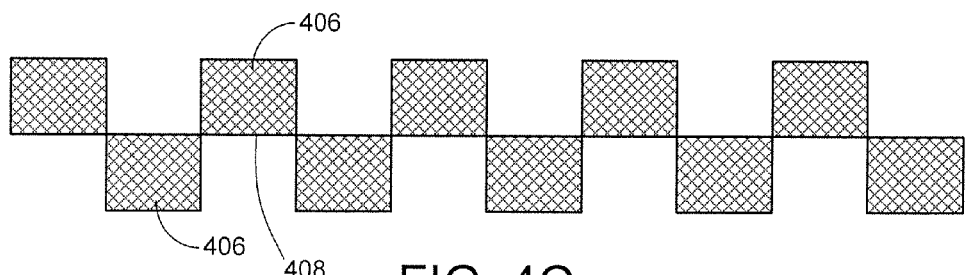
Figure 4D:
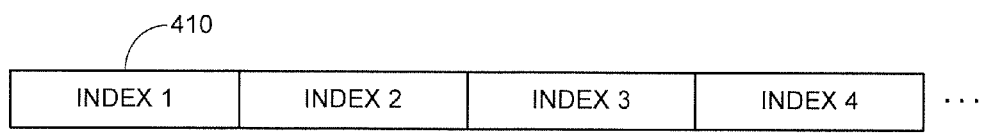

In other embodiments, the timing pattern may take the form of an offset pattern 406 as in FIG. 4C. The pattern 406 involves offset patterns that denote a centerline 408 that can be detected to determine the radial location of the pattern. In still further embodiments, the timing pattern may take the form of index fields 410, such as index fields 1-4 shown in FIG. 4D. In this case, each index field has a selected circumferential length and a unique identifier (including a sequentially incrementing identifier) so that the exact angular position of the cross-over points can be accurately determined based on the numerical values of the detected unique identifier values. In some cases, a unique identifier can be used to provide a once-around index point followed by a continuous pattern.

A variety of different forms and locations of the timing patterns are envisioned and can be used consonant with the foregoing discussion. In some cases, a moveable reader is used that tracks the eccentric timing pattern and, based on correction signals applied to maintain the reader over the timing pattern, the eccentricity of the substrate is calculated and compensated. In other cases, multiple readers are used such that a first reader may track the timing pattern to detect angular position and a second reader may track cross-over points to detect translational position. A servo type reader may oscillate slightly to detect and track the pattern. These and other alternative arrangements will readily occur to the skilled artisan in view of the present disclosure.

With reference again to FIG. 4A, in some embodiments the circumferentially extending timing pattern can be configured to include a once-around timing mark 412. The timing mark 412 is depicted as a radially extending mark that intersects the timing pattern 400 at a selected angular location on the substrate. The timing mark 412 enables detection of a once around angular position of the substrate, enabling the system to determine not only radial offset but angular offset as well.

In some embodiments, the radial extent of the timing mark 412 can be sized to accommodate the largest amount of radial offset that may be experienced by the remounting of the substrate. For example, if the maximum offset is expected to be about 10 nanometers, nm, then the timing mark 412 may be sized to extend at least ±5 nm from the timing pattern 400. In this way, the fixed reader 118 (FIG. 1) will be able to not only identify the two cross-over points but also detect the angular reference point, thereby enabling the writing of data to the remounted substrate at the correct angular locations. Other forms of angular timing marks can be used apart from that shown in FIG. 4A. The arrangement of FIG. 4A can thus be viewed as a circumferentially extending timing pattern that extends over a first radial distance and has a radially extending index mark that extends over a second, greater radial distance.

In still further embodiments, a fixed position optical pickup need not necessarily be used. With reference again to FIG. 1, the reader (R) 118 can be mounted to the actuator 116, or another actuator, and swept radially in a selected radial direction, such as from a position adjacent the outermost diameter (OD) of the substrate 110 towards the innermost diameter (ID) of the substrate until the timing pattern 204 (FIG. 2) is detected. By sensing the two cross-over points and the timing mark (e.g., 412), both the translational and angular offset of the substrate can be determined and correction signals supplied to adjust the placement of the overlaid data accordingly.

Figure 5:
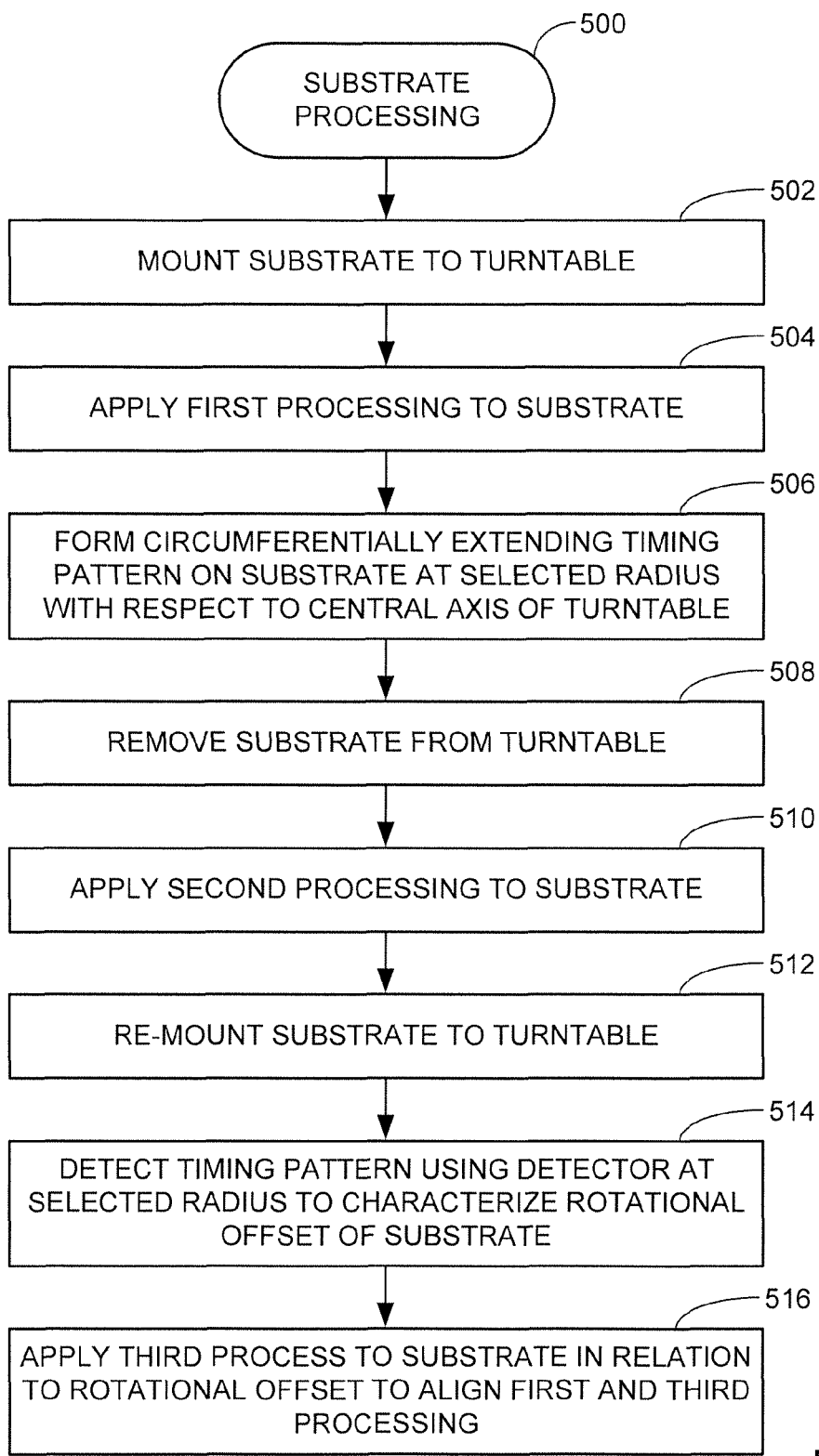
FIG. 5 is a substrate processing routine illustrative of steps that can be carried out in accordance with some embodiments.

FIG. 5 provides a flow chart for a substrate processing routine 500 to set forth steps that may be carried out in accordance with various embodiments. At step 502, a substrate such as the substrate 100 discussed above is mounted to a turntable such as the turntable 102 in FIG. 1. A first processing operation is applied to the substrate at step 504, such as but not limited to the use of a write beam such as from recording transducer 114 to the substrate to form a first series of features to the substrate.

A circumferentially extending timing pattern is formed on the substrate at step 506. This timing pattern may correspond to the pattern 200 in FIG. 2 and is nominally centered with respect to a central axis of the turntable from step 502.

At step 508, the substrate is removed from the turntable and a second level of processing is applied to the substrate at step 510. This processing can take any variety of forms, including but not limited to washing, etching, exposure, metallization, deposition, etc. The substrate is re-mounted to the turntable at step 512, which as discussed above may include translational and/or angular offsets with respect to the previous position of the substrate on the turntable.

The timing pattern is thereafter detected at step 514 during rotation of the substrate (via the turntable) to characterize the rotational offset of the substrate. As desired, the detected rotational offset is used as a compensation value during the application of a third level of processing to the substrate at step 516. This third level of processing can include the writing of a second series of features to the substrate, including features that overlay or otherwise combine with the first series of features to form combined features. While only two mountings of the substrate are represented in FIG. 5, it will be appreciated that multiple subsequent mountings can be made, and the same timing pattern can be used for each mounting. Alternatively, a separate timing pattern can be inscribed by each recording operation and multiple previously applied timing patterns can be detected and used to compensate a subsequent recording operation.

Figure 6:
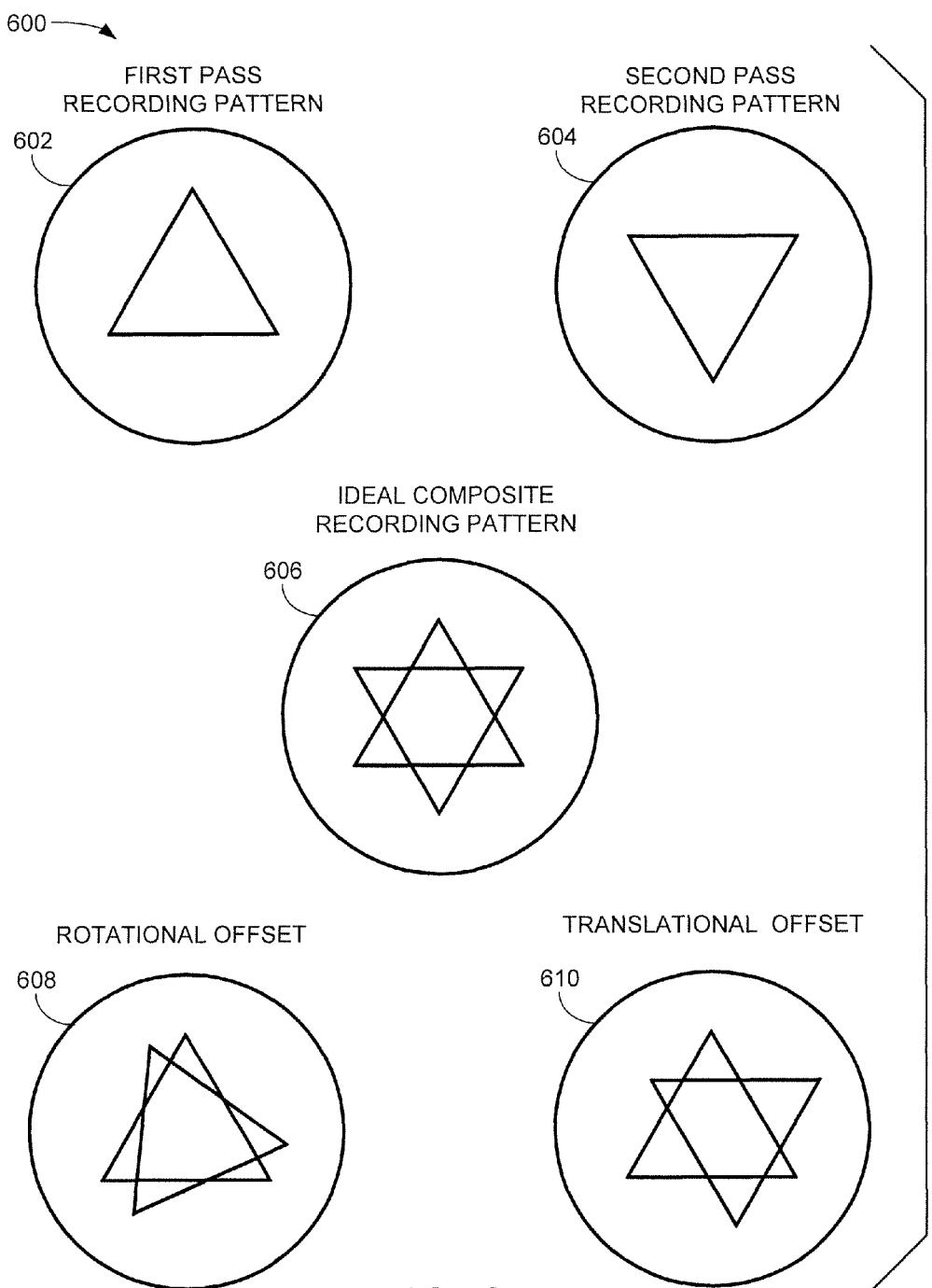
FIG. 6 illustrates various patterns (features) that may be formed using the routine of FIG. 5 in accordance with some embodiments.

FIG. 6 shows a sequence of patterns (features) 600 that may be overlaid onto a substrate using the routine of FIG. 5. A pattern 602 represents a first pass recording pattern and a pattern 604 represents a second pass recording pattern. Each of the patterns 602, 604 are depicted as triangles to provide a concrete example, but any suitable types of features can be used. An ideal composite recording pattern is depicted at 606, indicating proper alignment of the second pattern 604 onto the first pattern 602. In this sense, the patterns 602, 604 may be characterized as sub-features.

In practice, some misalignment of the respective patterns may arise as a result of misalignment of the substrate during the second installation as compared to the first in accordance with conventional alignment techniques. Combined pattern 608 shows the effects of rotational offset, and combined pattern 610 shows the effects of translational offset. It is contemplated that the use of the routine of FIG. 5 results in a nominal alignment such that the ideal combined recording pattern of 606 can be achieved irrespective of the physical differences in alignment of the substrate during the respective first and second passes.

FIG. 7 shows a substrate 700 aligned during multiple processes. Solid circle 702 represents a particular alignment of the substrate 700 during a first pass, and dotted circle 704 represents a subsequent alignment of the substrate 700 during a second pass. The amount of misalignment is exaggerated. Processing is applied to the substrate during each of the first and second passes, and intermediate processing may be applied to the substrate using other equipment between the first and second passes. Origin point 706 represents a center of rotation during the first pass, and origin point 708 represents a center of rotation during the second pass. Arrow 710 represents the translational and rotational difference between the respective origin points 706, 708.

FIG. 8A shows a pattern (feature) 800 centered about an intended origin point 802 on a substrate. The pattern 800 is written using multiple passes as discussed above. Using the compensation techniques described herein, the image is translated to provide translated pattern 804 centered about origin point 806, as shown in FIG. 8B.

Figure 9:
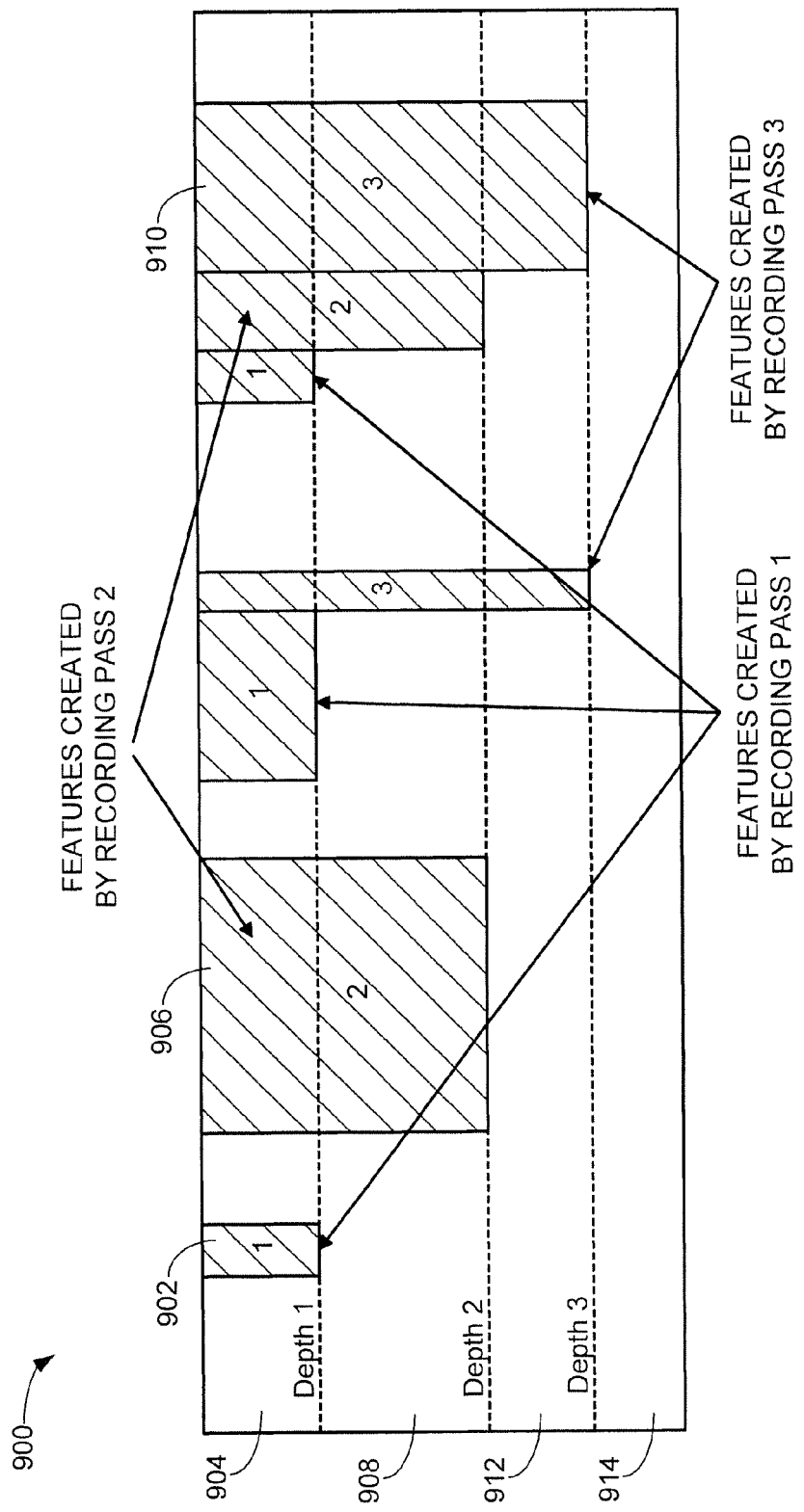
FIG. 9 illustrates another substrate formed in accordance with some embodiments.

FIG. 9 illustrates the application of three passes to form features 900 on a substrate having different dimensions, including different depths. The features can take any number of suitable forms including metallization areas, magnetic recording features, optically detectable features, etc. Features 902 have a first relative depth (Depth 1) and extend through a first layer 904. Features 906 have a greater, second relative depth (Depth 2) and extend through the first layer 904 and a second layer 908. Features 910 have a greater, third relative depth (Depth 3) and extend through the first and second layers 904, 908 as well as a third layer 912. A fourth layer 914 underlies and supports the upper layers 904, 908 and 912.

The respective features 902, 906 and 910 may be written during successively applied first, second and third passes. The substrate may be removed and remounted to an underlying turntable or other support mechanism (see FIG. 1) for each pass, and aligned as discussed above. Timing information in the form of one or more circumferentially extending timing patterns may be written during each pass, and prior written timing information can be used for subsequent alignment compensation.

In one embodiment, the substrate 900 is characterized as a recording substrate that is recorded and etched using three passes. For the first pass, the respective layers 904, 908 and 912 are deposited as a layer of recording resist and a write beam selectively exposes the resist in the locations of features 902.

After exposure, the substrate is removed and the resist is developed and used as an etching mask to etch down to the preselected Depth 1. The resist development can be either positive or negative, so that the resist that is removed to become the etching mask can either be those portions that were exposed during recording, or those portions that were not exposed during recording. It is contemplated that timing information such as pattern ID, sequence number, etc. are written, developed and etched into the recording substrate 900 for subsequent recovery by the recording apparatus.

After etching, a new layer of resist is placed on the surface of the recording substrate 900, and the substrate is remounted on the recording turntable. The recording system then records the data associated with the second pass. Optionally, the substrate or pattern ID and sequence number will be read prior to the beginning of recording to ensure the proper pattern is being recorded according to the design. Alignment compensation is also carried out as discussed above to ensure proper location of the second write operation. After exposure, the resist is developed and used as an etching mask to etch into the recording substrate down to the preselected Depth 2. The same process is repeated for the third pass, resulting in the finally formed features as shown in FIG. 9.

Any suitable coordinate system can be used to write the features to a given substrate, including angular coordinates, polar coordinates, XY coordinates, etc. It will be noted that detection of the use of the system as embodied herein can be readily determined by a skilled artisan through examination of a finished substrate, based on the characteristics of the features written thereto, as well as the relative alignment of the features with respect to the timing pattern.

In some embodiments, the substrate is configured as a biosciences substrate to facilitate various biomedical operations as a "lab on disc" or "lab on chip" type device. The finished substrate may be subjected to a partitioning (e.g., cutting) operation to cut the processed substrate into individual elements (e.g., pipettes, microfluidic channel networks, etc.), or the finished device may be retained as a rotatable disc (e.g., centrifuge devices, etc.).

These and other devices can be characterized as three-dimensional (3D) structures with internal passageways and other features to carry out various laboratory and other biomedical operations. Those skilled in the art will appreciate that such devices can be printed using XY CAD files and stepper lithography techniques where each "line" of features is printed at a time in a raster fashion. Because of the settle time required to dampen mechanical vibration at the end of each advancement of the write beam carriage, the printing of even a rudimentary pattern can take an extended period of time, such as on the order of hours or even days.

By contrast, the various embodiments disclosed herein can readily accept any number of inputs, including conventional XY CAD files, and print each layer during rotation of the underlying substrate. Coordinate conversion techniques to facilitate such writing (either as a continuous spiral or discrete rings) can be easily carried out using existing so-called "pit-art" writing methods in which XY designs are transferred to a rotating substrate over multiple passes and radial advancements of the write beam.

As before, the use of timing patterns can allow precise realignment of the write beam with respect to the new position of the substrate each time the substrate is remounted to a turntable or other support mechanism.

Figures 10A, 10B:
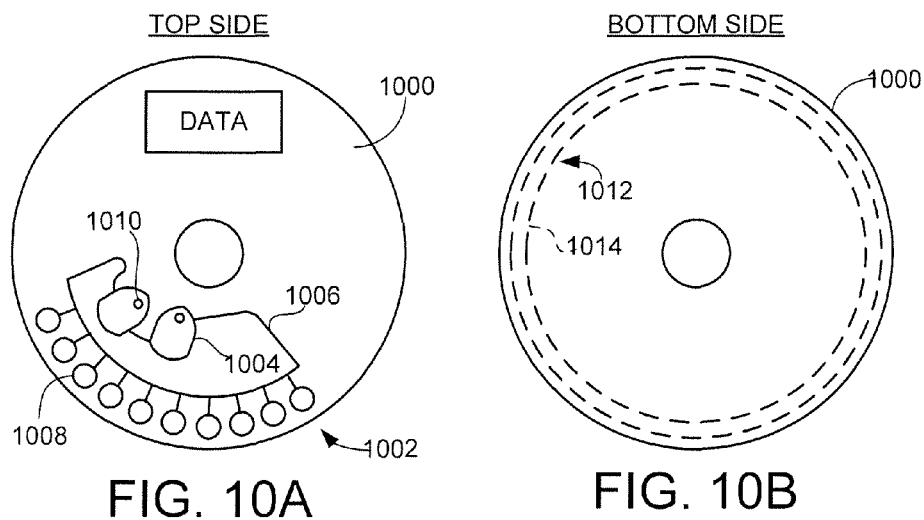
FIGS. 10A and 10B show another exemplary substrate characterized as a biomedical substrate in accordance with further embodiments.

FIGS. 10A and 10B illustrate a simplified diagram of a biomedical substrate 1000 in accordance with some embodiments. It will be appreciated that the substrate 1000 is merely exemplary and can take any number of suitable forms.

As depicted in FIG. 10A, a top side of the substrate 1000 (also referred to herein as a "disc") is adapted to facilitate a microbiological assay through the use of a microfluidic network embedded therein. An exemplary network 1002 includes various features such as reservoirs 1004, microchannels 1006 and microchambers 1008. Apertures 1010 facilitate the introduction of test fluids and the venting of trapped atmospheric and reaction gasses. It will be appreciated that a wide variety of microfluidic networks can be utilized, including networks that incorporate additional features such as microswitches, laser or magnetic activated microactuators, fluorescing detection marks, etc.

As depicted in FIG. 10B, the bottom side of the substrate 1000 may be optionally configured to incorporate at least one data zone 1012. The data zone 1012 may include one or more data tracks 1014. The tracks may be arranged as discrete concentric rings or as a continuous spiral. The data zone 1012 is adapted to store control information associated with the network 1002 in FIG. 10A.

In some embodiments, the data zone 1012 is formatted in accordance with an existing optical disc standard (e.g., CD-ROM, DVD, BD, etc.) so that the data stored therein are recoverable using existing reader technology. The data zone may be pre-recorded or recordable. While the data zone is shown to be located adjacent the outermost diameter (OD) of the disc 1000, the data zone may be located elsewhere, such as adjacent the innermost diameter (ID) or in a medial location of the disc surface. Placement of the data zone on the side opposite the network is contemplated, but not necessarily required. Other forms of indicia can be supplied for the data zone such as machine readable bar codes, human readable alphanumeric characters, etc.

Multiple data zones may be used. For example, if the top surface of the disc has sufficient room to accommodate a plurality of different networks to carry out different respective assays, an associated number of different data zones may be provisioned on the bottom surface for each of these networks. Alternatively, a single, combined data zone could be used to store data for these different multiple networks.

Figure 11:
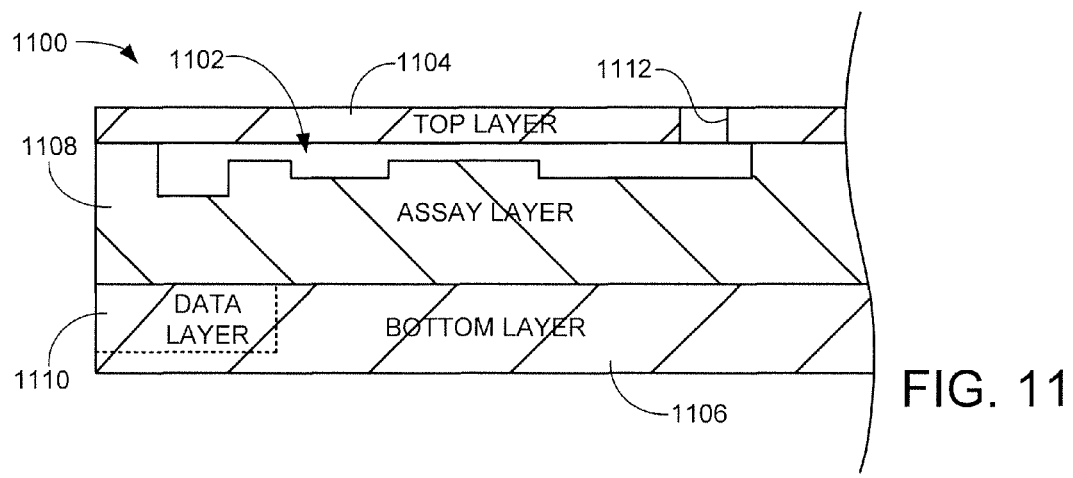
FIG. 11 is a cross-sectional elevational representation of a substrate having a three-dimensional (3D) structure formed thereon in accordance with the routine of FIG. 5 in some embodiments.

FIG. 11 provides a schematic depiction of various layers of a biomedical or other 3D structured disc 1100, which may be similar to the disc 1000 in FIGS. 10A-10B. The structure in FIG. 11 is merely exemplary and other arrangements of layers may be used. The final assembled disc 1100 may be a laminate of various layers that are separately formed and combined together during manufacture. A microfluidic network 1102 is formed from exemplary layers including opposing top and bottom layers 1104 and 1106, an assay layer 1108, and a data storage layer 1110.

The microfluidic network 1102 extends into the assay layer 1104 as a sequence of different recesses that extend different depths into the assay layer. The top layer 1104 may form a top surface for these various features. A fill/vent aperture 1112 can be arranged to extend through the thickness of the top layer 1104 as shown.

The data storage layer 1110 may be formed in the bottom layer 1106. In some embodiments, the top layer 1104, bottom layer 1106 and assay layer 1108 may be formed as separate substrates which are then bonded together to form a unitary substrate. In other embodiments, appropriate processing, such as injection molding, is applied to form a single substrate with features on opposing sides.

Figure 12:
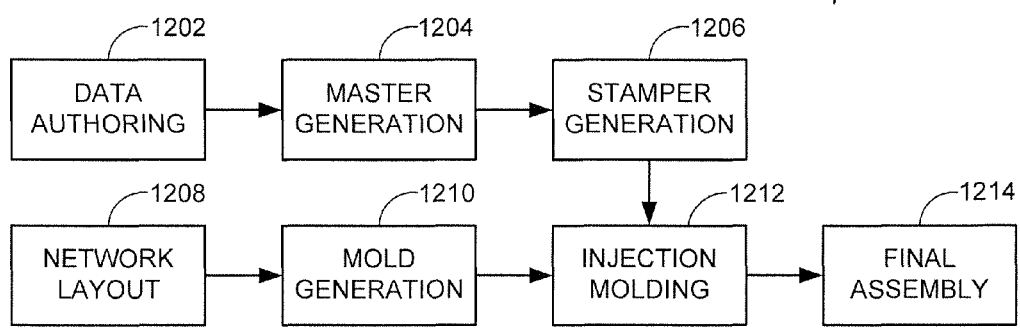
FIG. 12 is a functional flow diagram showing processing that may be applied to a substrate such as the exemplary substrates of FIGS. 10A, 10B and 11 in accordance with further embodiments.

FIG. 12 shows a processing sequence to form 3D substrates such as generally depicted in FIGS. 10A-10B and 11. FIG. 12 is merely exemplary as other processing steps may be used as required. A dual path is envisioned whereby separate processing is used to respectively format the data zone and the microfluidic network. It will be appreciated that timing patterns are written and utilized for alignment of the respective substrates over multiple processing operations as discussed herein.

Step 1202 represents a data authoring operation in which the control information to be stored to the disc is created and encoded in a form suitable for recording. A master generation step 1204 involves using a laser beam recorder (LBR), electron beam recorder (EBR) or similar equipment to form a master disc with the encoded control information.

A stamper generation step 1206 prepares a corresponding series of stampers suitable for disc replication. It will be noted that the foregoing steps can be carried out regardless whether the data zone is pre-recorded (embossed pits/lands) or recordable (data recordable layer); if the latter, the stamper may have wiggle pre-groove information to pre-define the locations for the data to be subsequently written to the disc. Stampers may be formed using suitable metallization processing to form various recessed features.

The steps involved in forming the network portion of the discs includes a network layout step 1208, and a mold generation step 1210. The mold generation provides the necessary molding features to form the various recesses that make up the network.

Once the molds/stampers are available, both are combined for use in an injection molding process at 1212 whereby a suitable molten material (e.g., plastic) is injected into the mold and cooled to provide single substrates with network features on one side and data features on the opposing side. Final assembly post processing may include the attachment of cover layers, the writing of the control information (if necessary), packaging, etc. as denoted at 1214. Such final assembly may include the partitioning (e.g., cutting) of the substrate into individual elements for use.

Second Embodiment—Linear Interpolation

Figure 13:
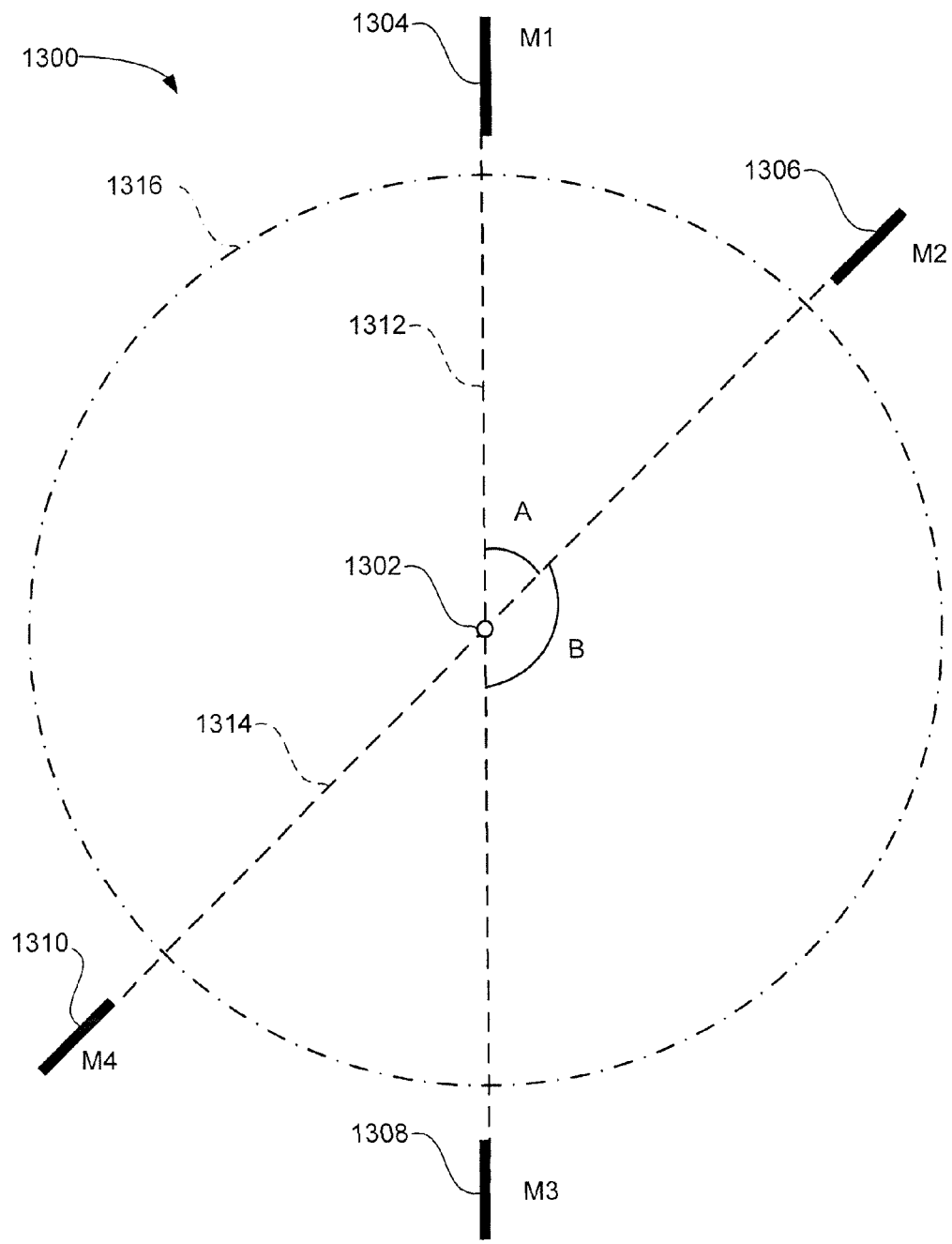
FIG. 13 is a schematic representation of another alignment timing pattern in accordance with further embodiments.

FIG. 13 shows another exemplary circumferentially extending timing pattern 1300 that may be constructed and used in accordance with further embodiments to detect substrate alignment through linear interpolation. The pattern 1300 is similar to the patterns discussed above, in at the pattern extends circumferentially about and enables detection of the location of a center point 1302 of a substrate to facilitate subsequent alignment operations involving the substrate. The manner in which translational and/or rotational offsets are determined, however, is somewhat different from the techniques discussed above.

As can be seen from FIG. 13, the timing pattern 1300 includes four (4) timing marks M1, M2, M3 and M4, numerically denoted at 1304, 1306, 1308 and 1310, respectively. The marks M1 and M3 are disposed nominally 180 degrees apart on opposing sides of the center point 1302, as are the marks M2 and M4. Each of the marks may have the same size and shape, or one of the marks (in this case, mark M1) may be different (e.g., longer) in order to provide a rotational reference point (index mark indicating the angular alignment of the medium).

The marks M1 and M3 serve to define a first reference line 1312. In some embodiments, the line 1312 aligns with the leading edges of marks M and M3, assuming counterclockwise rotation of the substrate with respect to a fixed position detector as discussed above. The marks M2 and M4 define a second reference line 1314, which also aligns with the leading edges of the respective marks.

The second reference line 1314 is skewed with respect to the first reference line 1312 by an acute angle A, which represents the angle between marks M1 and M2. A supplementary angle B extends between marks M2 and M3, so that A+B=180 degrees. Any suitable respective angles between lines 1312 and 1314 can be used so long as the first and second lines 1312, 1314 intersect. Suitable values for the angle A can include, but are not limited to, about 20 degrees up to about 160 degrees. An angle A of nominally 45 degrees is depicted. The reference lines 1312, 1314 are also referred to herein as timing mark axes.

The lines 1312, 1314 intersect at the center point 1302. By calculating the locations of these lines, the point at which they intersect can be accurately determined as the center of the substrate. The manner in which the respective lines can be calculated will be discussed below. While four marks and two corresponding lines are shown, any plural respective numbers of marks and lines can be used to define the center point.

Circle 1316 lies within the respective marks M1 through M4, and represents an area to which features may be written concurrently with the writing of the timing marks M1 through M4. In this way, as discussed above subsequently written features can be aligned with the initially written features. It is not necessarily required that the timing marks be written outside the area to which features are written provided the scanning system can reliably and accurately detect the various marks during subsequent substrate alignment operations.

Figure 14:
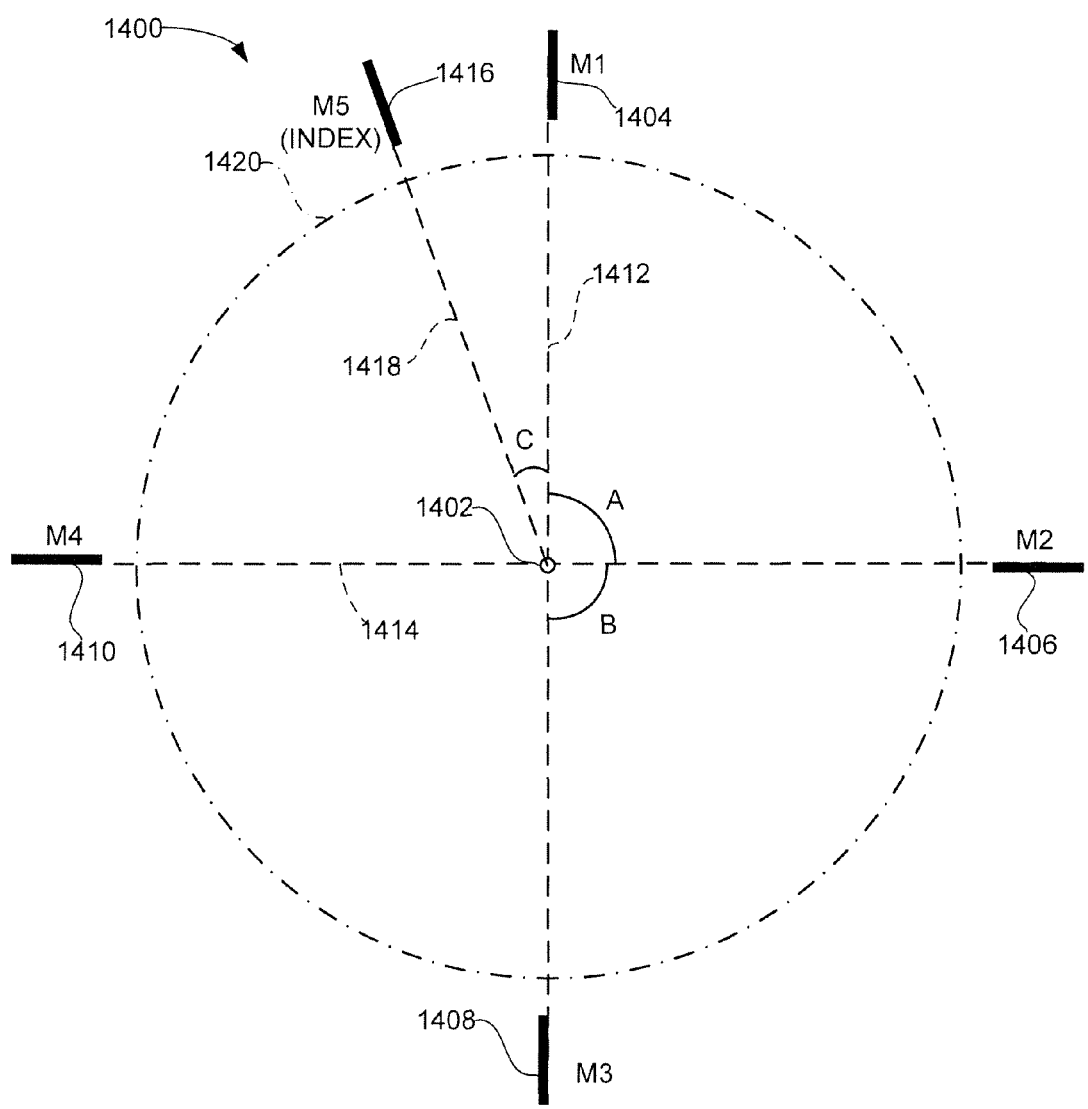
FIG. 14 is a schematic representation of another alignment timing pattern similar to the pattern of FIG. 13.

FIG. 14 shows another circumferentially extending timing pattern 1400 in accordance with further embodiments. The timing pattern 1400 is generally similar to the timing pattern 1300 of FIG. 13, and includes a center point 1402, timing marks M1 through M4 (numerically denoted 1404, 1406, 1408 and 1410), and first and second reference lines 1412, 1414 which intersect at the center point 1402. Each of the timing marks M1 through M4 are nominally identical and equally spaced about the center point although such is not required. As before, the reference lines 1412, 1414 are also sometimes referred to as timing mark axes.

The pattern 1400 includes a fifth timing mark M5, denoted at 1416. The fifth mark M5 serves as an index (angular) reference and is separated from the nearest adjacent mark M1 by angle C. The angle C can be any suitable value sufficient to enable accurate identification of each of the remaining marks M1 through M4. In the embodiment of FIG. 14, the angle C is nominally about 25 degrees, as denoted by the angle between the first reference line 1412 and a third reference line 1418. The timing mark M5 can be placed substantially anywhere about the circumference of the substrate, including between mark pairs M1 and M2 or between M3 and M4. The purpose of M5 is to enable the system to uniquely identify each of the other marks M1 through M4, and thereby detect the angular position of the substrate with respect to the underlying support structure. As before, a first set of features may be formed within boundary area 1420 concurrently with the formation of the timing marks M1 through M5.

Figure 15:
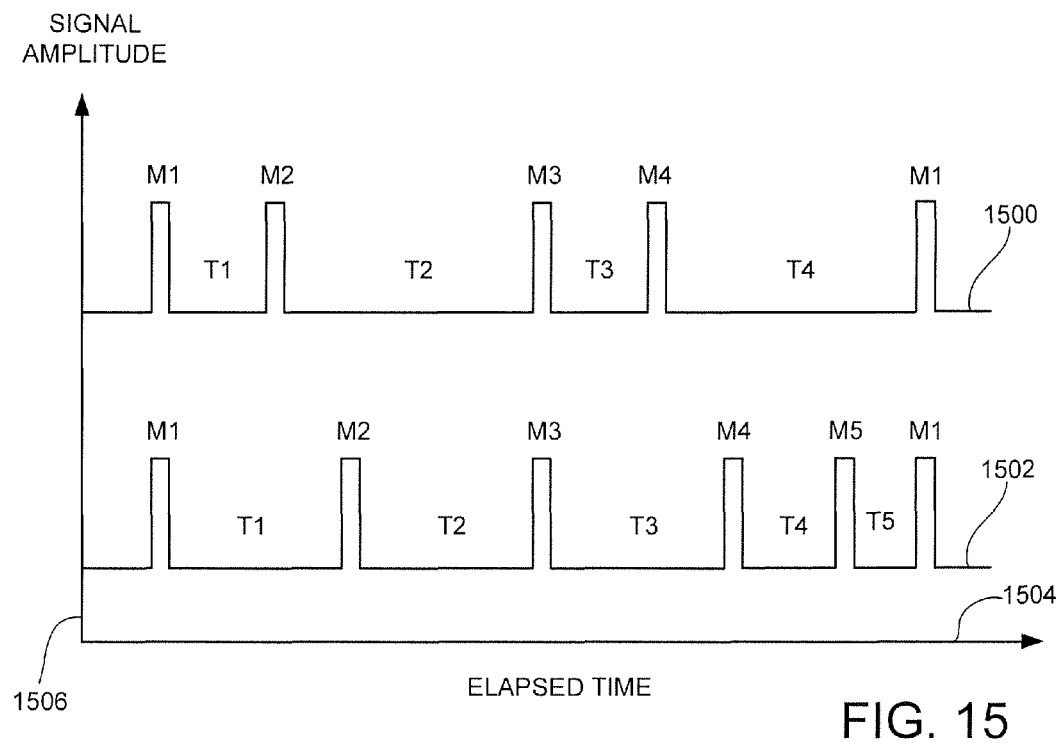
FIG. 15 is a graphical representation of readback timing signals obtained from the respective patterns of FIGS. 13 and 14 in some embodiments.

FIG. 15 is a timing diagram to generally illustrate timing signals that can be obtained from the respective timing marks in FIGS. 13-14. Timing curve 1500 generally represents a readback signal obtained from the arrangement in FIG. 13, and timing curve 1502 generally represents a readback signal obtained from the arrangement in FIG. 14. Both of these curves 1500, 1502 are plotted against a common x-axis 1504 and a shared amplitude y-axis 1506. It is contemplated that the timing curves are obtained by rotating each of the respective substrates using the readback system of FIG. 1 and providing a localized increase in output voltage/current (e.g., a pulse) responsive to passage of each respective timing mark under the sensor.

Curve 1500 shows the readback pulses that are obtained over more than a full revolution of the substrate. Corresponding timing intervals T1, T2, T3 and T4 are shown as the elapsed times between the detection of respective leading edges of the pulses. Other intervals can be defined such as times between trailing edges, times between adjacent edges, pulse midpoints, PW50 values, etc. Similar timing values T1 through T5 are provided for pulses M1 through M5 for curve 1502. While the pulses are rectangular, other detected shapes can be used based on both the nature of the timing patterns and the construction and response of the detector (sensor).

In FIG. 15, the respective timing intervals are nominally symmetric; that is, in curve 1500 the timing interval T1 is nominally equal to the timing interval T3 (T1=T3), and the timing interval T2 is nominally equal to the timing interval T4 (T2=T4). In curve 1502, T1=T3 and T2=T4+T5.

The skilled artisan will recognize that such symmetry would only exist if (discounting system noise and other effects) the substrate is perfectly aligned with the central axis of the underlying turntable. Should the substrate be offset with respect to the turntable, the timing intervals would not be symmetric; for example, if the substrate were shifted to the right as depicted in FIG. 2, the time interval T1 would be slightly longer than T3, and T2 would be slightly longer than T4 (or T4+T5).

Figure 16:
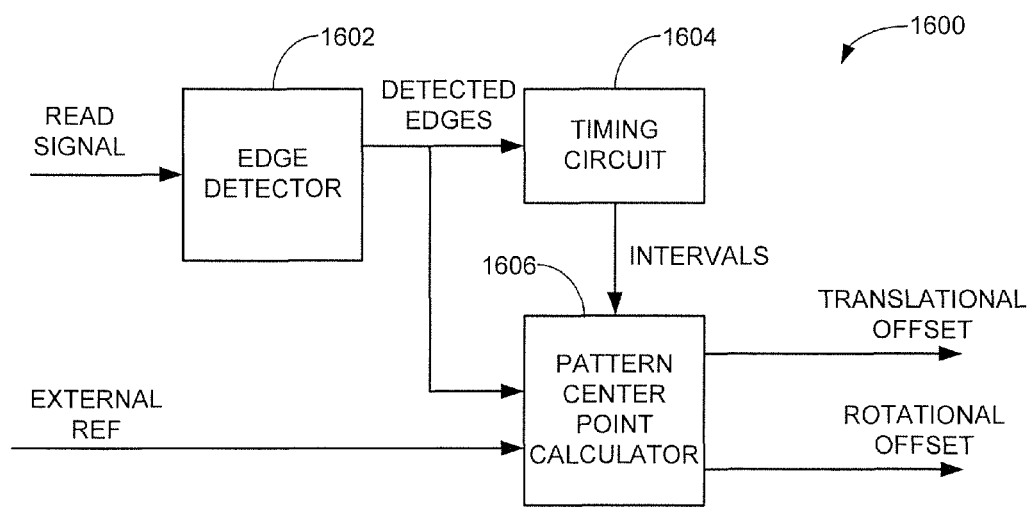
FIG. 16 is a functional representation of a center point determination circuit operative to determine translational and positional offsets using the patterns of FIGS. 13 and 14.

The offset of the substrate can be derived in relation to these individual timing intervals by plotting the respective reference lines shown in FIGS. 13-14 based on the respective ratios of these timing intervals. FIG. 16 shows a center point determination circuit 1600 operative in accordance with some embodiments to plot these lines and from that, obtain the requisite translational and rotational offset values. The circuit 1600 can be realized in hardware or software, including a hardware based circuit or a programmable processor with associated memory, such as embodied by the servo control processing circuit 108 discussed above in FIG. 1.

The circuit 1600 includes an edge detector circuit 1602 which detects selected edges of the respective pulses M1 through M4 (or M5) from FIG. 15. Both leading and trailing edges may be detected, although only certain edges (e.g., the leading edges which are first encountered by the sensor 118) may be used. A timing circuit 1604 outputs digital representations of the respective elapsed intervals between the selected detected edges. The detected edges, as well as the intervals, are supplied to a pattern center point calculator circuit 1606. The circuit 1606 may further receive an external reference value as required to enable the physical location of the reference point for the underlying structure (e.g., central axis 104, FIG. 1).

In some embodiments, the circuit 1606 performs a polar to xy coordinate conversion based on the relative timing obtained from the timing circuit 1604. Referring again to FIG. 13, assuming nominally constant speed rotation and no physical shift or movement of either the substrate or the sensor 118 relative to the table 102 during the measurement interval, the relative angular positions of the respective timing marks can be established. For example, the (arbitrary at this point) location of timing mark M1 may be assigned a value of 0 degrees. Based on the ratios of the respective timing intervals T1 through T4, corresponding angular locations of the marks M2, M3 and M4 can be determined. For example, M2 may be determined to be at nominally 47 degrees, M3 may be at 182 degrees, and M4 may be determined to be at nominally 240 degrees. These are merely for purposes of example and are not limiting.

Based on these respective locations about an imaginary circle of selected radius, a conversion can be made to convert these values to xy coordinates in an xy plane space. From there, it is a relatively straightforward process to plot the line 1312 between M1 and M3 and to plot the line 1314 between M2 and M4 using the well known linear formula:

$$y = mx + b \quad (1)$$

where x and y are the coordinates in the xy space, m is the slope and b is the y intercept. The point at which both lines cross (the intercept) easily follows, and can again be expressed in real xy coordinates with the xy coordinate of the reference point, or central axis, as the origin point (0,0) or some other suitable value in the xy space.

This provides a displacement value that can be used as the translational offset based on the distance between the center of the substrate (e.g., point 1302) and the central axis 104 (or other external reference). Rotational offset can be obtained through reliance upon the index mark (e.g., M1 in FIG. 13, M5 in FIG. 14) to establish the extent to which the substrate has been rotated, and in which rotational direction.

Once the translational and rotational offsets are known, these values can be used to generate compensation values to allow adjustments in the subsequent xy or rotational writing of subsequent features to the substrate in the manner discussed above.

Thus far, the various embodiments discussed above have been directed to recording systems that rotate the substrate to write the features and to write the timing pattern, as well as rotate the substrate in order to subsequently detect the timing pattern using a nominally stationary read sensor. While these embodiments are operative, such limitations are not necessarily limiting. FIG. 17 shows a recording system 1700 that uses a raster approach to move respective write and read elements adjacent a stationary substrate along a suitable coordinate system (such as, but not limited to, an xy coordinate system). The various timing patterns discussed above can accordingly be written and read without the need to rotate the substrate, which may be suitable for certain types of applications.

The system 1700 is generally similar to the rotatable recording system 100 of FIG. 1 and includes a number of generally similar components. Instead of a rotatable turntable, the system 1700 uses a fixed reference (stationary) support structure, or table 1702 with a fixed reference point 1704. The support structure 1702 can take any suitable form, including a granite or similar calibrated surface. A fixed reference point (external reference) can be any suitable point associated with the support structure 1702, including a point in the geometric center of the structure or off to one side. As noted above, while not limiting, calculations of offset compensation values can be readily obtained using this external reference point 1704 as the origin point in the applicable coordinate system.

A substrate 1710 is supported by the support structure 1702. The substrate may be merely placed on the structure or may be mechanically affixed thereto as required. It is desirable that the substrate not move relative to the underlying substrate during a given processing cycle.

The system 1700 further includes a signal generator circuit 1712 that operates in a manner similar to the circuit 112 in FIG. 1 to generate modulated write signals that are supplied to a write element 1714 to irradiate or otherwise impact the substrate using a write beam. The relative location of the write beam with respect to the substrate is advanced using an actuator 1716 and an xy raster control circuit 1718. The circuit 1718 operates in a manner similar to the control circuit 108 in FIG. 1 to position both the write element 1714 and a read sensor 1720 adjacent the stationary substrate 1710. As discussed above, the control circuit 1718 may take the form of a hardware circuit or a programmable processor. A local memory 1722 can include a data structure in the form of a table 1724 to handle various processing parameters, including translational and angular offset values.

At this point it will be noted that the use of so-called "pit art" is well known in the optical disc recording industry, wherein xy coordinate images are converted to polar coordinates and transferred to a disc surface in either xy or polar format. Those skilled in the art will appreciate that similar processing is employed to detect the timing patterns (e.g., 1300, 1400, etc.) using polar coordinates and performing a conversion into the xy space to detect the center point of the substrate, and then adjust the locations of the subsequently written features accordingly.

It will be apparent that timing marks such 1300 and 1400 in FIGS. 13-14, as well as other timing patterns disclosed herein, can be readily detected by advancing the read sensor 1720 in a stepwise fashion across the substrate 1710. This simplifies the calculation process carried out by the circuit 1600 in FIG. 16 since no polar coordinate conversion may be necessary; rather, the actual xy coordinates of the respective marks can be determined directly.

FIG. 18 shows another exemplary timing pattern 1800. In FIG. 18, four timing marks M1, M2, M3 and M4 denoted as 1802, 1804, 1806 and 1808 are utilized in a manner similar to that set forth above to locate a center point 1810 of the substrate via intersection of respective lines 1812, 1814. Rectangular box 1816 represents an area to which features are written. Features may be written beyond the respective timing marks, provided the detection system (e.g., system 1700) is configured to locate such using an xy scan for such marks.

The respective timing marks M1 through M4 comprise localized dots or points, in contrast to the elongated timing marks of FIGS. 13-14. The various timing marks M1 through M4 are not equidistant from the center point 1810, but instead are provided at different distances. While the timing patterns in FIGS. 13-14 are particularly suitable for rotational detection, stepped detection can be used for those patterns as well. Similarly, while the pattern 1800 in FIG. 18 is particularly suitable for stepped detection, rotatable detection can be used as well.

FIG. 19 illustrates another circumferentially extending timing pattern 1900 in accordance with further embodiments. Timing marks M1 through M4 are denoted as 1902, 1904, 1906 and 1908, and define a center point 1910 using intersecting lines 1912 and 1914. Unlike previous embodiments, it will be noted that the center point 1910 is not located in the geometric center of feature area 1916. It will be appreciated from FIG. 19 that the center point of the substrate need not necessarily correspond to either the geographic center of the substrate itself, or the pattern of features written thereto. Rather, through accurate measurement and coordinate conversion, the relative offset of the substrate and the location of every feature written thereto can be calculated with respect to the center point 1910 and the external reference (e.g., 1704 in FIG. 17).

Figure 20:
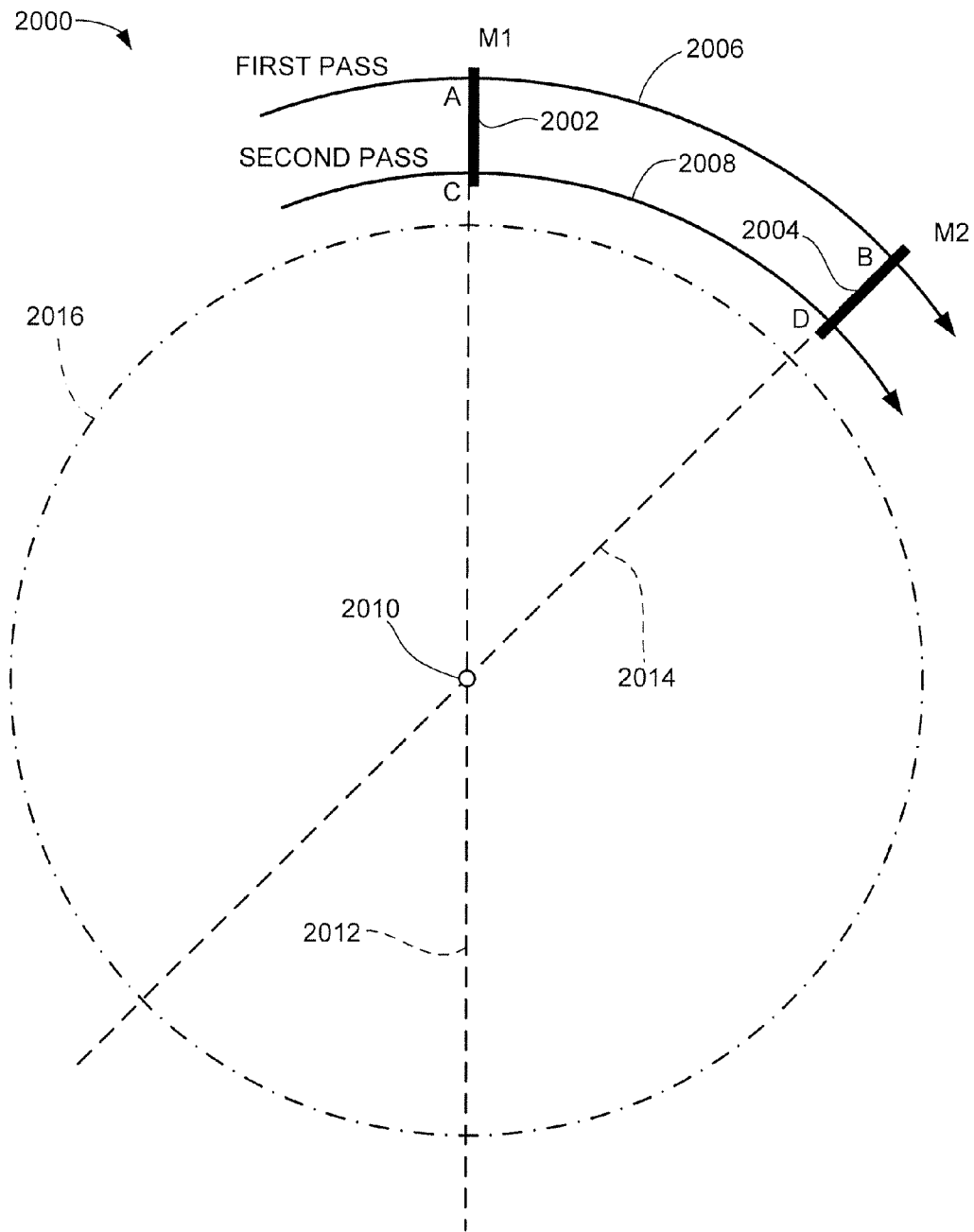
FIG. 20 is yet another exemplary timing pattern in accordance with some embodiments.

FIG. 20 shows yet another circumferentially extending timing pattern 2000. The timing pattern 2000 comprises two combined timing marks M1 and M2, denoted at 2002 and 2004. While the marks M1 and M2 can be detected using either a rotatable or stationary (stepped) search methodology, in the present embodiment a rotational detection method is used.

A first rotational pass of the read sensor 118 (see FIG. 1) is depicted by path 2006, and a second, subsequent rotational pass is depicted by path 2008. It will be appreciated that the read sensor in this embodiment remains stationary and the underlying substrate is rotated adjacent thereto to provide the relative detection paths shown. The two paths 2006, 2008 are carried out by advancing the read sensor to different respective radial locations with respect to the substrate. The distal edges of the respective marks M1 and M2 can be located by continuing to advance the read sensor in opposing radial directions until the terminal ends of the marks are detected.

The first pass 2006 detects a first end of the M1 timing mark identified as point A, and detects a first end of the M2 timing mark as point B. The second pass 2008 subsequently detects a second end of the M2 timing mark as point C, and detects a second end of the M2 timing mark as point D. Any number of intermediate edges along the respective marks can be detected as well, as can the distal ends of the marks.

A center point 2010 of the substrate can be detected by extrapolating line 2012 from detection points A, C and by extrapolating line 2014 from detection points B, D. The point at which these respective lines intersect define the location of the center point 2010, as before. From this, appropriate translational and angular offset compensation values can be determined for features written within feature area 2016. Indexing can be easily determined due to the irregular occurrence of the two marks M1, M2 over each complete revolution of the substrate.

From FIG. 20 it can be seen that it is not necessary to place the various timing marks on opposing sides of the center point of the substrate. Because it generally takes at least two points to define a line, the top and bottom ends of M1 form two distinct timing marks sufficient to define line 2012, and the top and bottom ends of M2 form two distinct timing marks sufficient to define line 2014.

Figure 21:
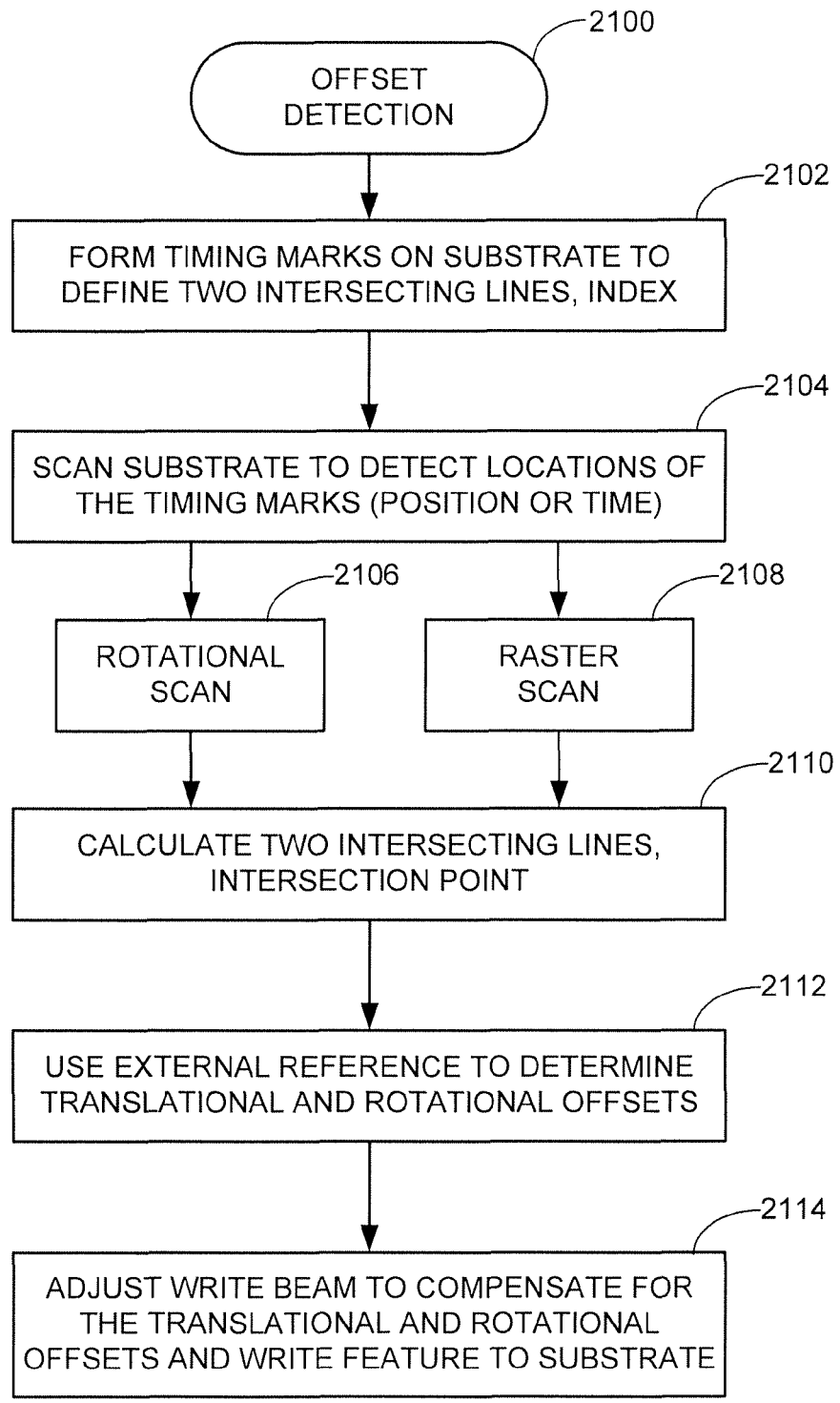
FIG. 21 is a flow chart for an offset detection routine illustrative of steps that may be carried out in accordance with various embodiments to detect timing patterns as discussed in FIGS. 1-20.

An offset detection routine 2100 is set forth by FIG. 21 to summarize the foregoing discussion. It will be appreciated that the various steps shown in FIG. 21 can be carried out in a variety of environments and by a number of different types of systems, including but not limited to the respective systems 100, 1700 in FIGS. 1 and 17.

As shown by step 2102, a circumferentially timing pattern formed of a number of timing marks are written to a substrate. The timing marks define at least two intersecting lines, as well as a rotational index location on the medium. As desired, other features may be written to the substrate during this step as well. In this way, the timing pattern provides a reference for the relative locations of these features.

At step 2104, the substrate is scanned to detect the locations of the respective timing marks, either using a position or timing reference. A timing reference may be suitable for a rotational scan, as indicated by step 2106, and a positional reference may be suitable for a raster (stepwise) scan, as indicated by step 2108. In either case, locations of the respective timing marks are identified by the scan, whether the read sensor is maintained stationary and the substrate rotates adjacent thereto, or the read sensor is advanced in stepwise fashion (including an xy, polar, spiral or other search strategy trajectory) relative to a stationary substrate. Multiple revolutions or scans may be used to detect the timing marks of the pattern.

At least two intersecting lines are calculated from the detected locations of the timing marks, as indicated at step 2110. The point at which the lines intersect is determined as the center point of the substrate (e.g., 1302, 1402, 2010). If more than two lines are calculated, an interpolation operation can be used to locate the center point between the intersection points to enhance accuracy, as necessary.

As shown at step 2112, an external reference (e.g., 104, 1704 in FIGS. 1, 17) is used in combination with the determined center point to establish the translational and rotational offsets of the placement of the substrate with respect to the initial alignment at which the timing pattern was written. This enables the write system to adjust the placement of the write beam to align subsequently written features with prior written features at step 2114.

It will be understood that the substrate is mounted to a suitable support mechanism at an initial alignment and it is this initial alignment that is memorialized by the timing pattern written at step 2102. This initial alignment is subsequently tracked and reestablished during subsequent mountings of the substrate, such as at step 2104.

While not expressly shown in the routine of FIG. 21, it is contemplated that the substrate will have been removed and subjected to intervening processing, including the processing discussed above in FIG. 12, between steps 2102 and 2104. The system used to write the initial timing pattern may be the same system that subsequently detects and writes additional features to the substrate. Alternatively, a first system may write the timing pattern and a different, second system may be used to subsequently detect the timing pattern and write additional features using a compensated write beam.

Third Embodiment—Timing Mark Counts

Figure 22:
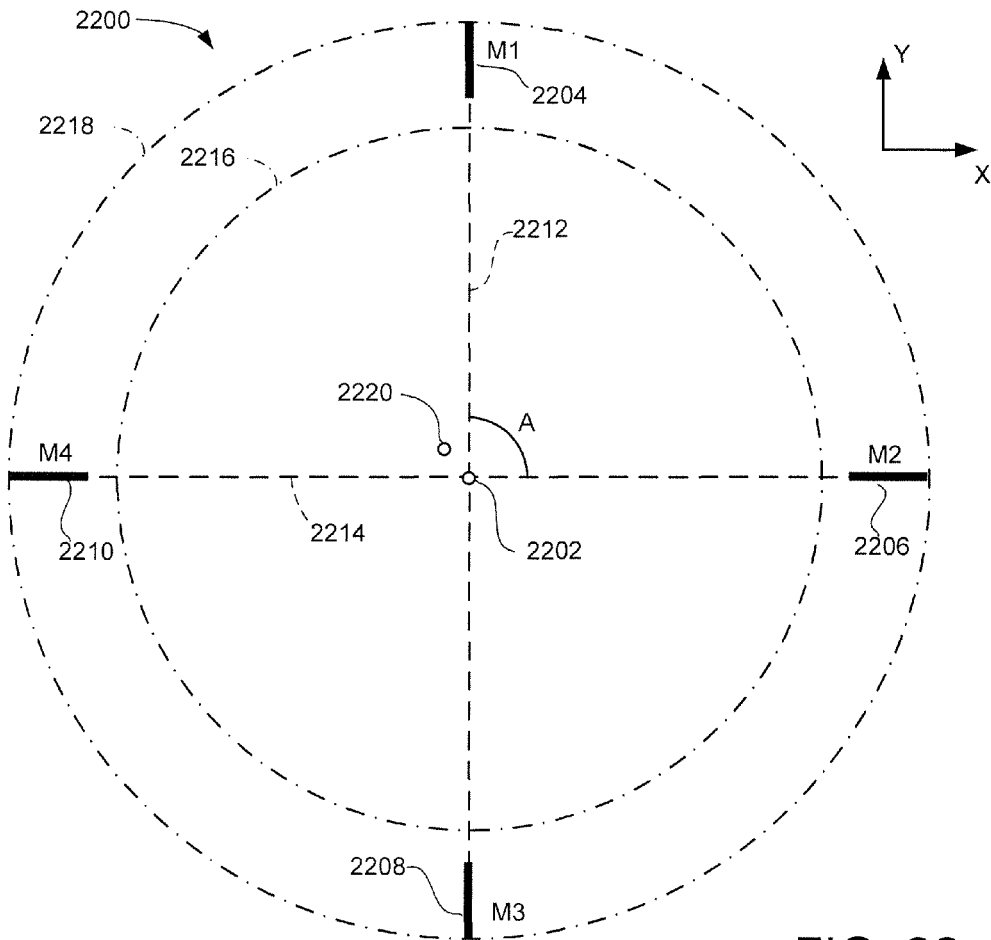
FIG. 22 is another arrangement of an exemplary timing pattern in accordance with further embodiments of the present disclosure.

FIG. 22 shows yet another timing pattern 2200 in accordance with further embodiments that detect substrate alignment offset through the accumulation of timing mark counts. The pattern 2200 is similar to the pattern 1400 in FIG. 14, so that the techniques discussed above can be applied to the pattern arrangement of FIG. 22, and vice versa.

As before, the pattern 2200 is formed of four (4) timing marks M1, M2, M3 and M4, numerically denoted at 2202, 2204, 2206 and 2208. The timing marks, also sometimes referred to as spokes, are nominally 90 degrees apart (e.g., angle A=90 degrees). The illustrated arrangement is merely exemplary and not limiting as other angles, relative spacings and total numbers of marks may be used. The marks are shown to be aligned along respective intersecting lines 2210 (aligned along an x-axis or x-direction) and 2212 (aligned along a y-axis or y-direction). The center of the pattern is denoted at center point 2214.

The timing marks M1, M2, M3 and M4 extend inwardly from an outermost radius $R_O$ to an innermost radius $R_I$. The outermost radius $R_O$ of each mark is at a precisely fixed radius of selected magnitude, as indicated by broken circle 2216. The innermost radius $R_I$ is at a second nominally fixed radius of lesser magnitude, as indicated by broken circle 2218. Recording area ($R_A$) 2220 is disposed within the inner radius $R_I$ and represents an area to which various features discussed above may be formed.

Figure 23:
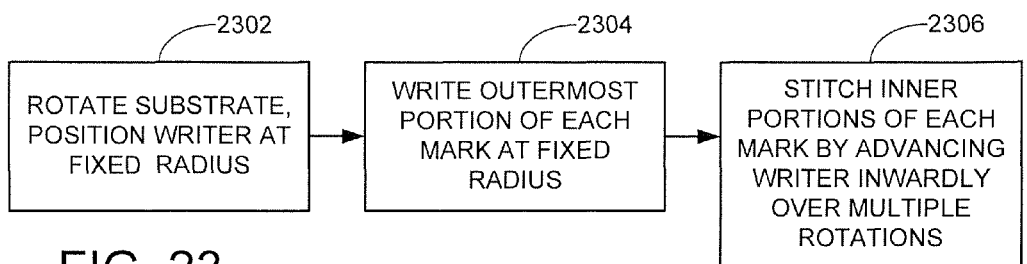
FIG. 23 is a process flow illustrating steps that may be carried out to form the timing marks that form the timing pattern of FIG. 22.

FIG. 23 shows a process flow to write the timing marks M1-M4 in FIG. 22. At step 2302, the substrate is mounted to a turntable and rotated at a constant velocity. A writer element capable of forming the respective timing marks is placed at a fixed radius corresponding to the outermost radius $R_O$.

At step 2304, the outermost portion of each of the marks M1-M4 is written while the writer element is maintained at the initial fixed radius. Various control circuits discussed above can be used to precisely locate the outermost portions at the same nominal radius $R_O$.

At step 2306, inner portions of the timing marks M1-M4 are stitched together over several subsequent passes by incrementally advancing the position of the writer inwardly. This writing continues until the innermost radius $R_I$ is reached, after which the mark write process is completed. Any number of passes can be used to provide the marks with the desired respective radial lengths.

Figure 24:
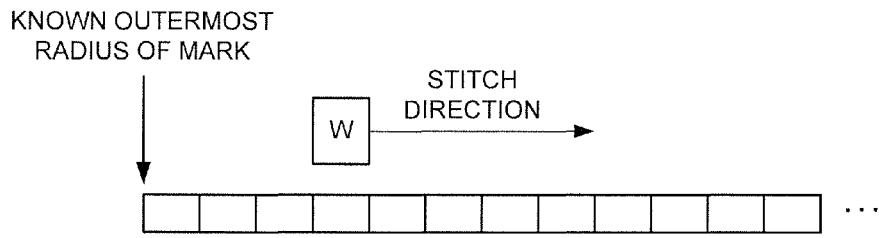
FIG. 24 is a schematic representation of one of the timing marks of FIG. 22.

FIG. 24 shows one of the timing marks (in this case, the M1 mark 2202 from FIG. 22) in greater detail. A write element 2402 is advanced inwardly, either continuously or in a step-wise fashion, to write a succession of mark segments 2404 to the substrate, beginning with an initial mark segment 2404A at the innermost radius and then continuing from there over successive rotations. Each of the segments 2404 nominally have a radial width that corresponds to the effective write width of the write element 2402. It will be noted that other timing marks, such as the marks in FIG. 14, may be written using a similar process. The individual segments 2404 are shown for clarity, but it will be understood that the overall mark will comprise a continuous feature with a nominally constant width and consistent detection characteristic (e.g., the mark may be a "dark line" for an optical detection system, etc.).

While operable to form timing marks, the foregoing process has been found to have a number of limitations due to various mechanical tolerances and offsets that are inherently involved in the formation of such marks. The outermost radius $R_O$ can be formed with a high level of precision through the simple expedient of initiating rotation of the underlying substrate, moving the write element 2402 to the desired radius, allowing any resonances or other vibrations to dampen, and using a closed loop timing/clock circuit to write the first segment 2404A to each timing mark in turn. Thus, the outermost edges of the first segments 2404A can be precisely aligned at the desired outermost radius $R_O$.

As the transducer is moved inwardly, small, yet significant, errors may arise in the locations of the remaining segments 2404. These errors will affect the placements of the remaining segments, so that the overall marks may not be perfectly straight will or may not point exactly toward the center point 2214 (see FIG. 22). Stated another way, while the calculation of the intersecting lines discussed above for the pattern of FIG. 14 et seq. may provide adequate resolution in some cases, this technique may not provide the requisite accuracy for other cases. Accordingly, a different approach may be used that compensates for such mechanical tolerances in the system.

Figure 25:
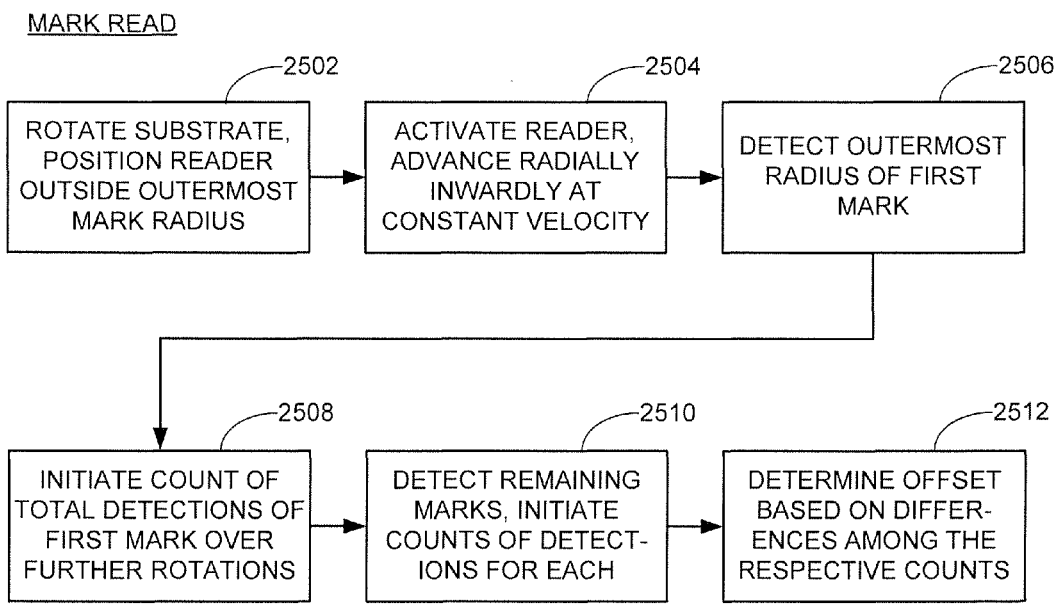
FIG. 25 illustrates an inward translation of a detector (reader) during use of the timing marks.

FIG. 25 is a simplified representation of a substrate having another timing pattern 2500 with four timing marks M1, M2, M3 and M4 generally similar to the timing marks in FIG. 22. The marks are denoted respectively at 2502, 2504, 2506 and 2508, and are shown to have exaggerated length and proximity. As before, marks M2 and M4 are nominally aligned horizontally along x-axis line 2510, and marks M1 and M3 are nominally aligned vertically along y-axis line 2512 to intersect at center point 2514. All of the marks M1-M4 have the same outermost radius $R_O$ from the center point.

A reader element (R) is denoted at block 2516. Path 2518 shows a spiral path taken by the reader 2516 relative to the substrate as the substrate is rotated at a constant rotational velocity and the reader is advanced inwardly at a constant linear (radial) velocity. One "track pitch" in radial distance is crossed by the reader over each revolution of the substrate. This distance, referred to as TP, is exaggerated in FIG. 25. It is presumed that there is some unknown rotational and/or translational offset between the rotational center of the turntable (e.g., central axis 104, FIG. 1) and the center point 2514 of the pattern.

The reader 2516 is initially located outside (beyond) the outermost radius $R_O$.

As the substrate is rotated and the reader 2516 begins moving inwardly, a first timing mark will eventually be detected by the reader (in this case, timing mark M4 in FIG. 25). At this point, the reader is nominally at the outermost radius $R_O$. The remaining marks M1-M3 are not detected during this first complete revolution. All four marks M1-M4 are detected by the reader during the second complete revolution, and over each subsequent revolution. A precise determination of the location of the center point 2514 can be determined by tracking the total number of crossover points that are detected for each of the marks for each revolution.

Figures 26, 27:
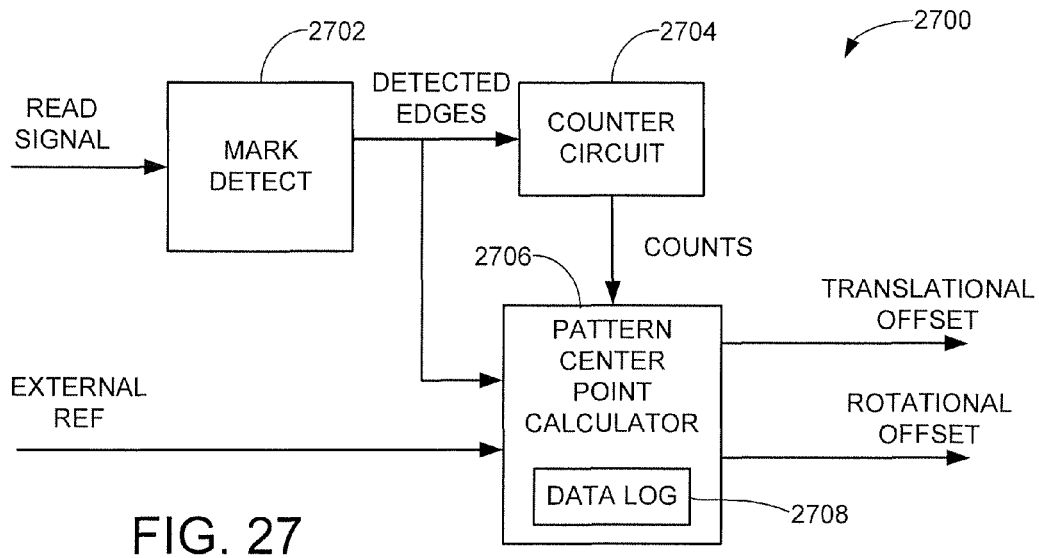
FIG. 26 is a process flow illustrating steps that may be carried out to detect the timing pattern in some embodiments.
FIG. 27 is a count table stored as a data structure in a memory obtained during the process of FIG. 26.

FIG. 26 provides an operational flow to describe this process. At step 2602, a substrate with a timing pattern such as 2500 in FIG. 25 is provided with multiple circumferentially extending timing marks, all of which have the same outermost radius $R_O$. The substrate is mounted to a turntable and rotated at a selected velocity, and a reader such as 2516 is placed at a location outside the outermost radius.

The reader is activated and radially advanced inwardly at a constant velocity at step 2604. At some point, based on the misalignment of the substrate, the initial position of the reader and the track pitch (TP) covered by the reader over each revolution, the reader will eventually detect the outermost radius of a first mark, step 2606. A count is initiated at step 2608 to count the total number of detections (crossovers) of the first mark that occur during subsequent rotations.

Each of the remaining marks are subsequently detected during subsequent rotations and corresponding counts are initiated for each of these marks as well at step 2610. Finally, at a suitable rotation in which all of the marks are detected, the offset of the substrate is determined based on differences among the various counts, step 2612.

FIG. 27 shows an exemplary format for a count table that can be used to collect count data during the process of FIG. 26. The format is merely illustrative and not limiting, as other forms of data structures can be used. The table is stored in a suitable memory location accessible by a processing device.

Four (4) marks are used in the table denoted as M1 (Y1), M2 (X1), M3 (Y2) and M4 (X2). These marks are radially arranged as shown in FIG. 25, so that marks M1 and M3 are aligned along the y axis (Y2 and Y1) and marks M2 and M4 are aligned along the x axis (X2 and X1).

Data for fourteen (14) consecutive rotations are stored in the table, although data may be collected for as few or as many rotations as desired, including counts that show passage of the reader past the innermost radius $R_I$ of the respective marks. Rotations are identified with respect to base rotation N, representing the rotation during which the first mark was detected (in this case, mark M3/Y2). Individual counts of mark detections are accumulated in the table for each subsequent rotation.

Once one or more rotations have been identified that cross all of the timing marks, the translational offsets in the x and y axis directions can be determined as follows:

$$X_{OFFSET} = (X2-X1)(TP)/2 \quad (2)$$

and $$Y_{OFFSET} = (Y2-Y1)(TP)/2 \quad (3)$$

where $X_{OFFSET}$ represents the offset of the center point (e.g., 2514 in FIG. 25) of the substrate with respect to the rotational axis (e.g., rotational axis 104 in FIG. 1) of the turntable in the x-axis direction, $Y_{OFFSET}$ is the offset of the center point of the substrate with respect to the rotational axis of the turntable in the y-axis direction, X1, X2, Y1 and Y2 are the respective counts for the timing marks at the respective 9:00, 3:00, 12:00 and 6:00 positions, and TP is the track pitch distance over which the reader is advanced over each rotation.

Using the data from track rotation N+7 in the count table from FIG. 27 and a TP value of 0.3 μm (0.3×10⁻⁶ m), the respective offsets can be determined as:

$$X_{OFFSET} = (X2-X1)(TP)/2 = (7-6)(0.3)/2 = 0.15 \text{ μm} \quad (4)$$

and $$Y_{OFFSET} = (Y2-Y1)(TP)/2 = (4-8)(0.3)/2 = -0.60 \text{ μm} \quad (5)$$

In other words, the center point of the substrate is 0.15 μm away from the rotational center of the substrate in the x-axis direction, and −0.60 μm away from the rotational center of the substrate in the y-axis direction. These offsets can be used to adjust the final location of the subsequently written features in a manner discussed above. It will be noted that the same results from equation (4) and (5) are obtained for any track along which all four timing marks were crossed in the count table of FIG. 27.

An advantage of the approach of FIG. 26 is that the actual locations of the individual timing marks M1-M4 does not affect the calculations, since it is the differences between the total number of times each of the marks is detected over each revolution, rather than individual timing between the marks, that determine the overall offset values. The same results would be obtained even if significant error existed in the locations of the timing marks. Stated another way, even if the various marks were skewed or otherwise canted so as to not be directly pointing toward the center of the substrate, so long as each of the timing marks begin at a known radial location (e.g., each mark begins at the same $R_O$ and at least the outermost portion of each mark is respectively arrayed at 12:00, 3:00, 6:00 and 9:00), the offsets in the x and y directions (relative to the marks) can be determined.

Table I provides various dimensions for timing marks in one embodiment:

TABLE I

| | |
|---|---|
| Wafer Diameter | 200 mm |
| Mark (Spoke) Length | 0.750 mm (750 μm) |
| Mark Innermost Radius ($R_I$) | 78.15 mm |
| Mark Outermost Radius ($R_O$) | 78.9 mm |
| Mark Width | 0.015 mm |
| Track Pitch (TP) | 0.3 μm |
| Data (Feature) Write Area Diameter | 120 mm |

In the example of Table I, each mark is approximately 2500 revolutions in length. Other respective dimensions may be used as desired. As noted above, it is not necessary to scan the entire length of each mark, although additional encoded information can be supplied such as by using marks of different respective lengths. While the foregoing embodiments contemplate beginning at a point beyond the outermost radius $R_O$, this is merely exemplary and not required. In other embodiments, each of the timing marks may have a fixed radius at the innermost radius $R_I$, and the reader is swept outwardly away from the center of the substrate to detect the respective timing marks.

Figure 28:
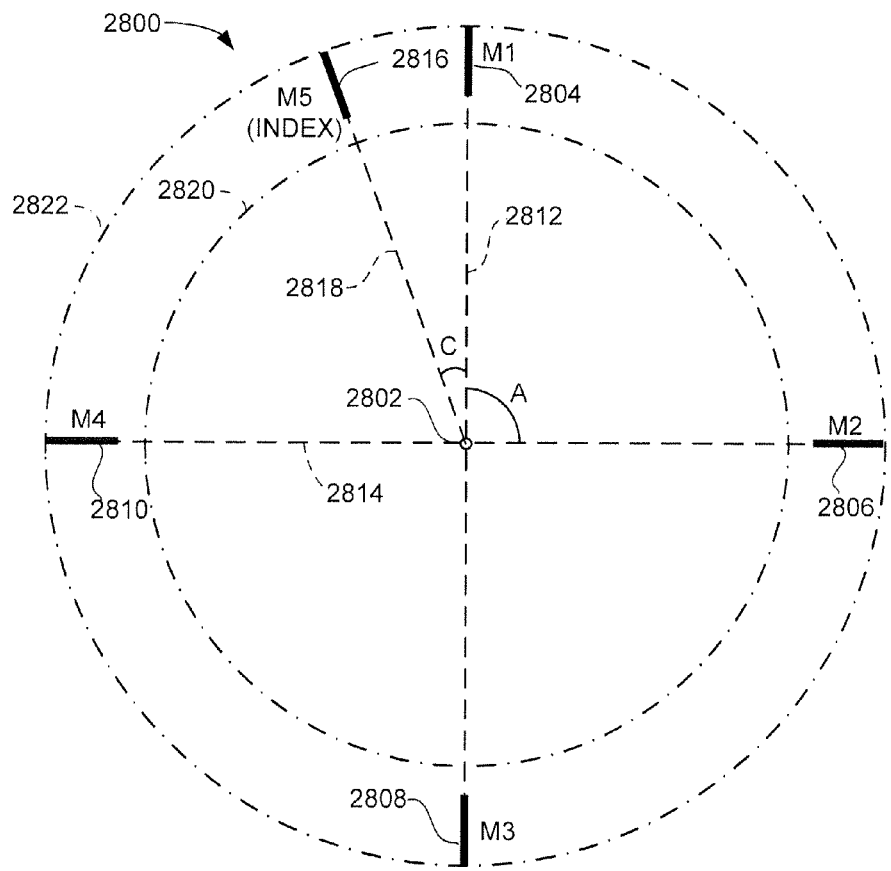
FIG. 28 is another arrangement of an exemplary timing pattern in accordance with further embodiments of the present disclosure.

FIG. 28 provides another substrate with a five mark (five spoke) timing pattern 2800. Timing marks M1-M4 are denoted at 2802, 2804, 2806 and 2808 and are arrayed at 90 degree intervals. A fifth timing mark M5 is denoted at 2810 and is at a known selected angle C from another mark, such as 30 degrees from mark M1.

The addition of the fifth mark M5 can be used to determine the rotational offset of the substrate with respect to the axis of rotation in a number of ways, such as by determining the timing intervals between the respective marks as discussed above. It will be noted that the timing pattern 2800 in FIG. 28 is similar to the pattern 1400 of FIG. 14, so that multiple embodiments discussed above can be used to determine the rotational and translational offset of the associated substrate.

Figure 29:
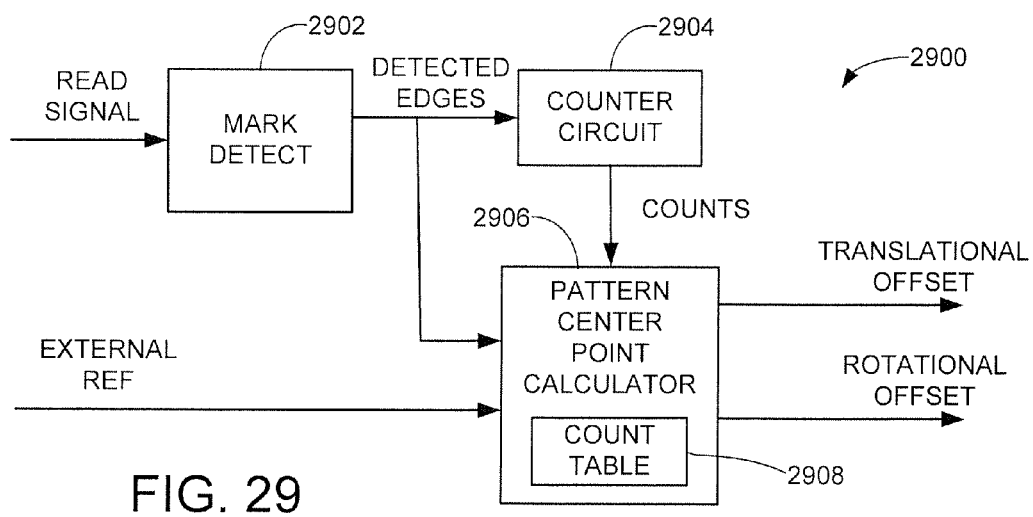
FIG. 29 is a functional representation of a center point determination circuit operative to determine translational and rotational offsets using the respective patterns of FIGS. 22 and 28.

FIG. 29 is a functional block representation of a center point determination circuit 2900 operative to determine translational and rotational offsets using the respective patterns of FIGS. 22 and 28 in some embodiments. As before, the circuit can be realized as programming stored in a suitable memory location and executed by a programmable processor, as a specially configured non-programmable hardware circuit, etc.

A mark detect circuit 2902 obtains an output read signal from the read element (detector) during advancement of the read element across the pattern using a spiral read path as in FIG. 25. Detected edges of the timing marks are provided to a counter circuit 2904 which increments individual counts of the detection of each of the respective marks, and supplies the same to a pattern center point calculator circuit 2906. The circuit 2906 uses an external reference of the servo circuit to track the rotations of the substrate and accumulate the counts in a count table 2908. Once sufficient data have been collected, the circuit 2906 calculates the translational offset and, as required, the rotational offset of the pattern.

Offset compensation signals are thereafter used to adjust the writing of features to the substrate to align with previously written features.

Figure 30:
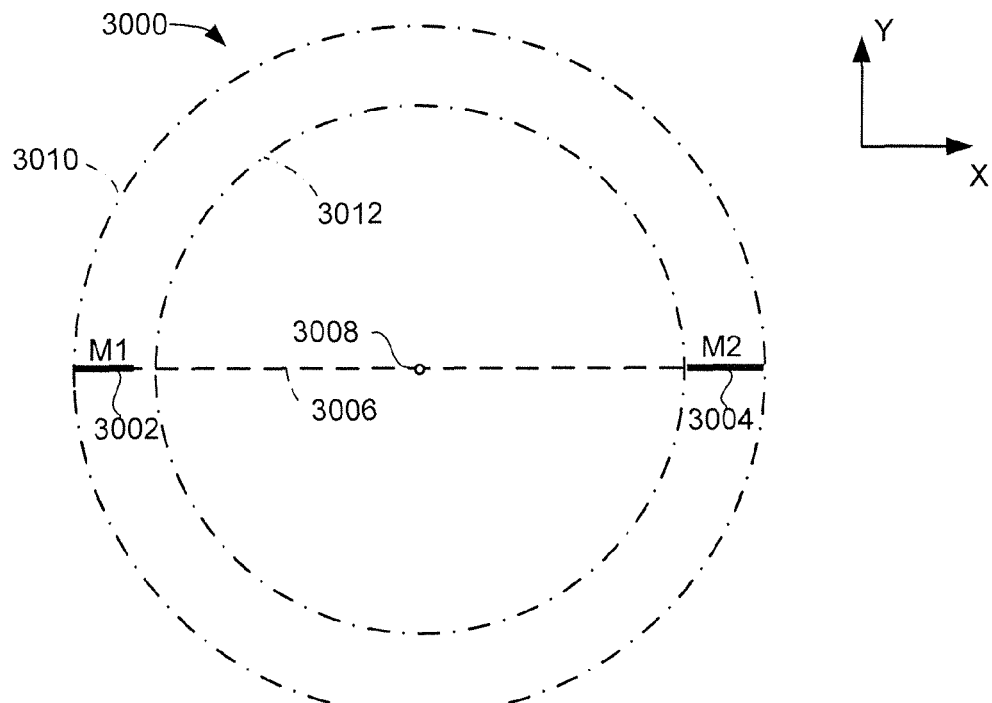
FIG. 30 shows yet another timing pattern in accordance with further embodiments.

The foregoing embodiments have utilized four or more timing marks in the respective timing patterns. This is illustrative but not necessarily limiting. FIG. 30 shows a timing pattern 3000 that only uses only a single pair of timing marks M1, M2. The M1 and M2 timing marks 3002, 3004 are 180 degrees apart and aligned along a timing mark axis 3006 that nominally intersects substrate center point 3008. The M1 and M2 timing marks each have an outer radius $R_O$ at a predetermined radius, indicated by circle 3010. Mark M2 has a longer length than the M1 mark, enabling detection of the innermost portion of M2 to identify a suitable once-per-rev index point. Features are written to feature area 3012 disposed within the timing pattern 3000 as before.

The respective offset determination circuits 2900 of FIG. 29 and 1600 of FIG. 16 calculate offsets in different ways from the same or similar timing marks. The skilled artisan will recognize in view of the foregoing discussion that measuring the timing intervals obtained between marks M1 and M2 in FIG. 30 as carried out by the circuit 1600 can be used to determine the amount of translational offset in the y-axis (e.g., vertical) direction. Concurrently counting the number of respective detection events of each of the M1 and M2 marks as carried out by the circuit 2900 can be used to determine the amount of translational offset in the x-axis (e.g., horizontal) direction. Thus, by using the respective circuits 1600, 2900, both x and y axis offsets can be determined using the same two marks.

Moreover, sweeping the reader element inwardly and counting mark detections can be used to identify the longer mark M2, since at some point the reader will have moved inside the innermost radius of M1 but will still detect M2 for a number of successive rotations. Rotational (angular) offset of the substrate can be determined by detecting the angular difference between M2 and the rotational reference of the system, as discussed above.

Figure 31:
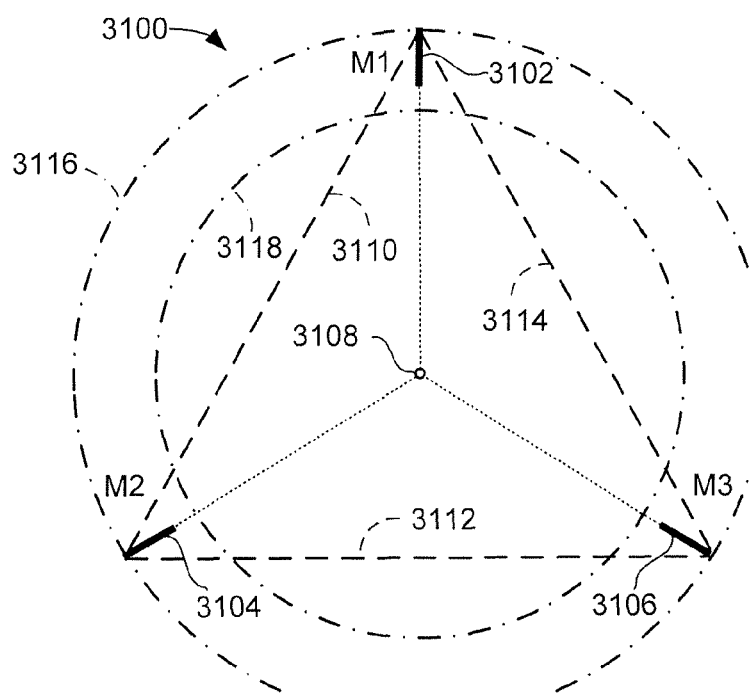
FIG. 31 shows still another timing pattern in accordance with further embodiments.

FIG. 31 shows another timing pattern 3100 with three (3) timing marks M1, M2 and M3. The M1-M3 timing marks are denoted at 3102, 3104 and 3106 respectively and are nominally 120 degrees apart so as to be equally spaced about center point 3108. The marks are respectively aligned along three timing mark axes: line 3110 is the axis between M1 and M2; line 3112 is the axis between M2 and M3; and line 3114 is between M3 and M1. These axes align along the outermost radii $R_O$ of the M1-M3 marks (denoted by circle 3116) and form an equilateral triangle. Additional lines can be formed at other locations, including at the innermost radii ($R_I$) of the marks. As before, area 3118 provides a feature writing area within the timing pattern 3100.

The various techniques of the respective circuits 1600 and 2900 can be readily applied to the three timing marks M1-M3 to determine the offset associated with center point 3108. Once the relative locations of the axes 3112, 3114 and 3118 (e.g., the equilateral triangle) are known, a simple geometric conversion can be used to locate the center point 3108, with each of the timing mark axes having components of both x-axis and y-axis offset. An index point can be added to enable identification of rotational offset, such as by adding a fourth mark or elongating one of the existing marks.

It will now be appreciated that the various embodiments presented herein can be adapted for a wide variety of different applications, including but not limited to optical discs, magnetic recording discs, semiconductors, biomedical (e.g., lab on disc) devices, other forms of 3D structures, etc.

Similarly, while the alignment processing has been applied in the context of processing that employs application of a write beam to the substrate, it will be appreciated that this is also merely exemplary and is not necessarily limiting in that any number of different forms of processing can be applied to the substrates as desired once the translational and/or angular offsets of the substrate are identified.

What is claimed is:

1. A method comprising:
    writing a circumferentially extending timing pattern comprising spaced apart first and second timing marks disposed on opposing sides of a center point of a substrate along a timing mark axis;
    writing a first feature in a write zone radially disposed within the timing pattern;
    mounting the substrate to a support mechanism;
    rotating the support mechanism and the substrate about a central axis, the center point of the substrate offset from the central axis by an offset distance along the timing mark axis;
    determining the offset distance responsive to successive detection of the first and second timing marks by a detector over at least one rotation of the support mechanism and the substrate; and
    using the offset distance determined during the determining step to adjust a write beam to write a second feature that adjoins the first feature during continued rotation of the support mechanism and the substrate about the central axis.

2. The method of claim 1, wherein the first timing mark is nominally 180 degrees offset from the second timing mark so that the timing mark nominally intersects the center point.

3. The method of claim 1, wherein the determining step comprises:
    positioning the detector at an initial radius that is beyond an outermost radius of, or within an innermost radius of, the respective first and second timing marks;
    radially advancing the detector at a constant radial velocity in a direction toward the first and second timing marks during continued rotation of the substrate at a constant rotational velocity so that the detector advances along a spiral path with respect to the rotating substrate at a constant track pitch;
    initially detecting a selected one of the first or second timing marks as the detector continues to move along the spiral path and incrementing a first counter to accumulate a first overall count of total detections of the selected one of the first or second timing marks over a plurality of rotations of the substrate;
    subsequently detecting the remaining one of the first or second timing marks as the detector continues to move along the spiral path and incrementing a second counter to accumulate a second overall count of total detections of the remaining one of the first or second timing marks over the plurality of rotations of the substrate, the first count higher than the second count; and
    computing the offset distance in relation to a difference between the first count and the second count.

4. The method of claim 1, wherein the determining step comprises:
    positioning the detector to detect the respective first and second timing marks at a selected radius with respect to the axis of rotation of the substrate over a plurality of revolutions of the substrate;
    calculating a centerline that intersects the first and second timing marks responsive to a first timing interval between detection of the first timing mark and the second timing mark and responsive to a second timing interval between the detection of the second timing mark and a subsequent detection of the first timing mark; and computing the offset distance in relation to the calculated centerline.

5. The method of claim 1, wherein the timing mark axis is a first timing mark axis, the offset distance is a first offset distance in a first direction, and the circumferentially extending timing pattern further comprises spaced apart third and fourth timing marks between the respective first and second timing marks, the third and fourth timing marks disposed on opposing sides of the center point of the substrate along a second timing mark axis, the third and fourth timing marks used during the determining step to determine a second offset distance of the center point of the substrate in a second direction.

6. The method of claim 5, wherein each of the first, second, third and fourth timing marks have a respective outermost radius that is at the same distance from the center point, and wherein the first offset distance and the second offset distance are respectively determined during the determining step responsive to differences in total accumulated detection counts for each of the first, second, third and fourth timing marks for a given revolution of the substrate about the central axis.

7. The method of claim 5, wherein the determining step comprises calculating a first intersecting line from the first timing mark to the second timing mark, calculating a second intersecting line from the third timing mark to the fourth timing mark, identifying a crossover point at which the second intersecting line intersects the first intersecting line, and determining the respective first and second offset distances responsive to a location of the identified crossover point.

8. The method of claim 5, wherein the first, second, third and fourth timing marks are arranged so as to be nominally 90 degrees apart about the center point.

9. The method of claim 8, wherein the circumferentially extending timing pattern further comprises a fifth timing mark between the first timing mark and the second timing mark.

10. The method of claim 1, wherein the first and second timing marks and the first feature are written to the substrate during a first mounting of the substrate to the support mechanism, and during a subsequent, second mounting of the substrate to the support mechanism, a second feature is written to the substrate in at least partial overlapping relation to the first feature by a write beam adjusted in relation to the determined offset distance.

11. The method of claim 1, wherein the first and second timing marks are each characterized as a radially extending line that points toward the center point of the substrate, wherein each of the first and second timing marks has an innermost radius and an outermost radius, wherein a selected one of the innermost radius and the outermost radius for each of the first and second timing marks is at the same predetermined radial distance from the center point, and the respective first and second timing marks are of different lengths so that the remaining one of the innermost radius and the outermost radius for each of the first and second timing marks is at a different predetermined radial distance from the center point.

12. The method of claim 1, wherein the support mechanism is a turntable of a recording system.

13. An apparatus for writing a feature to a substrate having a circumferentially extending timing pattern comprising spaced apart first and second timing marks disposed on opposing sides of a center point of the substrate along a timing mark axis, the apparatus comprising:

a support mechanism configured to rotate the substrate about a central axis, the central axis offset from the center point of the substrate by an offset distance;

a detector moveable with respect to the substrate and configured to respectively detect the first and second timing marks during rotation of the substrate about the central axis by the support mechanism; and a control circuit configured to determine the offset distance responsive to successive detection of the first and second timing marks by the detector over at least one rotation of the support mechanism and the substrate; and a write beam assembly configured to apply a write beam to write a first feature to the substrate in a write zone radially disposed within the timing pattern, wherein the control circuit applies a compensation value to the write beam assembly to adjust the write beam to write a second feature in alignment with the first feature to the substrate in the write zone, the control circuit generating the compensation value responsive to the offset distance.

14. The apparatus of claim 13, wherein the control circuit is further configured to position the detector at an initial radius that is beyond an outermost radius of, or within an innermost radius of, the respective first and second timing marks, radially advance the detector at a constant radial velocity in a direction toward the first and second timing marks during continued rotation of the substrate at a constant rotational velocity so that the detector advances along a spiral path with respect to the rotating substrate at a constant track pitch until the detector initially detects a selected one of the first or second timing marks as the detector continues to move along the spiral path, increment a first counter to accumulate a first overall count of total detections of the selected one of the first or second timing marks over a plurality of rotations of the substrate, continue to advance the detector along the spiral path with respect to the rotating substrate at the constant track pitch until the detector subsequently detects the remaining one of the first or second timing marks, increment a second counter to accumulate a second overall count of total detections of the remaining one of the first or second timing marks over the plurality of rotations of the substrate, and compute the offset distance in relation to a difference between the first count and the second count.

15. The apparatus of claim 13, wherein the control circuit is further configured to position the detector to detect the respective first and second timing marks at a selected radius with respect to the axis of rotation of the substrate over a plurality of revolutions of the substrate, calculate a centerline that intersects the first and second timing marks responsive to a first timing interval between detection of the first timing mark and the second timing mark and responsive to a second timing interval between the detection of the second timing mark and a subsequent detection of the first timing mark, and compute the offset distance in relation to the calculated centerline.

16. The apparatus of claim 13, wherein the timing mark axis is a first timing mark axis, the offset distance is a first offset distance in a first direction, and the circumferentially extending timing pattern further comprises spaced apart third and fourth timing marks between the respective first and second timing marks, the third and fourth timing marks disposed on opposing sides of the center point of the substrate along a second timing mark axis, and wherein the control circuit is further configured to determine a second offset distance in a second direction between the center point of the substrate and the central axis responsive to detection, by the detector, of the third and fourth timing marks.

17. The apparatus of claim 16, wherein each of the first, second, third and fourth timing marks have a respective outermost radius that is at the same distance from the center point, and wherein the control circuit is further configured to determine the first offset distance and the second offset distance are respectively responsive to differences in total accumulated detection counts for each of the first, second, third and fourth timing marks for a given revolution of the substrate about the central axis.

18. The apparatus of claim 16, wherein the control circuit is further configured to calculate a first intersecting line from the first timing mark to the second timing mark, calculate a second intersecting line from the third timing mark to the fourth timing mark, identify a crossover point at which the second intersecting line intersects the first intersecting line, and determine the respective first and second offset distances responsive to a location of the identified crossover point.

19. A method comprising:
  mounting a substrate to a support mechanism, the substrate having a circumferentially extending timing pattern comprising spaced apart first and second timing marks disposed on opposing sides of a center point of a substrate along a timing mark axis;
  rotating the support mechanism and the substrate about a central axis, the center point of the substrate offset from the central axis by an offset distance along the timing mark axis; and
  determining the offset distance responsive to successive detection of the first and second timing marks by a detector over at least one rotation of the support mechanism and the substrate, the determining step comprising:
    positioning the detector to detect the respective first and second timing marks at a selected radius with respect to the axis of rotation of the substrate over a plurality of revolutions of the substrate;
    calculating a centerline that intersects the first and second timing marks responsive to a first timing interval between detection of the first timing mark and the second timing mark and responsive to a second timing interval between the detection of the second timing mark and a subsequent detection of the first timing mark; and
    computing the offset distance in relation to the calculated centerline.

20. An apparatus for writing a feature to a substrate having a circumferentially extending timing pattern comprising spaced apart first and second timing marks disposed on opposing sides of a center point of the substrate along a timing mark axis, the apparatus comprising:
  a support mechanism configured to rotate the substrate about a central axis, the central axis offset from the center point of the substrate by an offset distance;
  a detector moveable with respect to the substrate and configured to respectively detect the first and second timing marks during rotation of the substrate about the central axis by the support mechanism;
  a control circuit configured to determine the offset distance responsive to successive detection of the first and second timing marks by the detector over at least one rotation of the support mechanism and the substrate by positioning the detector at an initial radius that is beyond an outermost radius of, or within an innermost radius of, the respective first and second timing marks, radially advancing the detector at a constant radial velocity in a direction toward the first and second timing marks during continued rotation of the substrate at a constant rotational velocity so that the detector advances along a spiral path with respect to the rotating substrate at a constant track pitch until the detector initially detects a selected one of the first or second timing marks as the detector continues to move along the spiral path, incrementing a first counter to accumulate a first overall count of total detections of the selected one of the first or second timing marks over a plurality of rotations of the substrate, continuing to advance the detector along the spiral path with respect to the rotating substrate at the constant track pitch until the detector subsequently detects the remaining one of the first or second timing marks, incrementing a second counter to accumulate a second overall count of total detections of the remaining one of the first or second timing marks over the plurality of rotations of the substrate, and computing the offset distance in relation to a difference between the first count and the second count.

* * * * *